(12) United States Patent
Lee et al.

(10) Patent No.: US 9,831,222 B2
(45) Date of Patent: Nov. 28, 2017

(54) DISPLAY DEVICE USING SEMICONDUCTOR LIGHT EMITTING DEVICE AND METHOD FOR MANUFACTURING THE SAME

(71) Applicant: LG ELECTRONICS INC., Seoul (KR)

(72) Inventors: Eunah Lee, Seoul (KR); Sangwook Byun, Seoul (KR); Hwankuk Yuh, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/140,339

(22) Filed: Apr. 27, 2016

(65) Prior Publication Data

US 2017/0117257 A1     Apr. 27, 2017

(30) Foreign Application Priority Data

Oct. 26, 2015  (KR) .......................... 10-2015-0148965

(51) Int. Cl.
*H01L 25/075*     (2006.01)
*H01L 33/32*     (2010.01)
(Continued)

(52) U.S. Cl.
CPC ........ *H01L 25/0753* (2013.01); *H01L 33/007* (2013.01); *H01L 33/0079* (2013.01);
(Continued)

(58) Field of Classification Search
CPC .......... F21K 9/50; F21K 9/60; F21Y 2101/00; H01L 33/38; H01L 33/387;
(Continued)

(56) References Cited

U.S. PATENT DOCUMENTS

| 4,984,035 A * | 1/1991 | Kanzawa ................... B41J 2/45 257/627 |
| 6,455,880 B1 * | 9/2002 | Ono ........................ H01L 23/66 257/275 |

(Continued)

FOREIGN PATENT DOCUMENTS

| JP | 2014-232841 A | 12/2014 |
| JP | 2015159172 A * | 9/2015 |
| KR | 10-0972980 B1 | 7/2010 |

*Primary Examiner* — Sophia Nguyen
(74) *Attorney, Agent, or Firm* — Birch, Stewart, Kolasch & Birch, LLP

(57) ABSTRACT

A display device including a substrate; a first electrode on the substrate; and a plurality of semiconductor light emitting devices disposed on the first electrode; and a second electrode. Further, at least one of the semiconductor light emitting devices includes a first conductive semiconductor layer; a second conductive semiconductor layer overlapping with the first conductive semiconductor layer; and an active layer between the first conductive semiconductor layer and the second conductive semiconductor layer. In addition, an upper surface of the second conductive layer includes a recess groove having a bottom portion and a lateral wall portion formed along an edge of the second conductive semiconductor layer, and the second electrode extends partially on the bottom portion of the groove and on the lateral wall portion.

12 Claims, 17 Drawing Sheets

(51) Int. Cl.
*H01L 33/62* (2010.01)
*H01L 33/24* (2010.01)
*H01L 33/38* (2010.01)
*H01L 33/00* (2010.01)
*H01L 33/50* (2010.01)
*H01L 33/60* (2010.01)
*H01L 33/58* (2010.01)

(52) U.S. Cl.
CPC .............. *H01L 33/24* (2013.01); *H01L 33/32* (2013.01); *H01L 33/382* (2013.01); *H01L 33/505* (2013.01); *H01L 33/58* (2013.01); *H01L 33/60* (2013.01); *H01L 33/62* (2013.01); *H01L 2933/0066* (2013.01)

(58) Field of Classification Search
CPC ......... H01L 25/0753; H01L 2933/0066; H01L 33/007; H01L 33/0079; H01L 33/24; H01L 33/32; H01L 33/382; H01L 33/505; H01L 33/58; H01L 33/60; H01L 33/62; H05K 1/113; H05K 1/189; H05K 2201/0145; H05K 2201/0154; H05K 2201/10106; H05K 3/323
See application file for complete search history.

(56) References Cited

U.S. PATENT DOCUMENTS

| | | | | |
|---|---|---|---|---|
| 6,635,902 B1* | 10/2003 | Lin | H01L 25/0753 | 257/88 |
| 7,221,044 B2* | 5/2007 | Fan | H01L 27/153 | 257/676 |
| 7,372,078 B2* | 5/2008 | Jang | H01L 33/46 | 257/103 |
| 7,566,910 B2* | 7/2009 | Kim | H01L 33/46 | 257/95 |
| 7,897,420 B2* | 3/2011 | Chu | H01L 33/20 | 257/98 |
| 7,939,841 B2* | 5/2011 | Lee | H01L 33/20 | 257/98 |
| 8,237,185 B2* | 8/2012 | Park | H01L 25/167 | 257/30 |
| 8,405,113 B2* | 3/2013 | Kazama | H01L 33/20 | 257/86 |
| 8,440,995 B2* | 5/2013 | Hwang | H01L 33/14 | 257/13 |
| 8,536,612 B2* | 9/2013 | Lee | H01L 27/153 | 257/103 |
| 8,598,615 B2* | 12/2013 | Jeong | H01L 33/38 | 257/98 |
| 8,686,447 B2* | 4/2014 | Tomoda | H01L 25/0753 | 257/100 |
| 8,803,185 B2* | 8/2014 | Ling | H01L 33/62 | 257/668 |
| 8,896,008 B2* | 11/2014 | Donofrio | H01L 33/20 | 257/98 |
| 9,070,841 B2* | 6/2015 | Yamada | H01L 33/36 | |
| 9,093,629 B2* | 7/2015 | Rhee | F21K 9/50 | |
| 9,117,971 B2* | 8/2015 | Jeong | H01L 33/145 | |
| 2004/0080941 A1* | 4/2004 | Jiang | H01L 24/18 | 362/84 |
| 2005/0199885 A1* | 9/2005 | Hata | H01L 33/20 | 257/79 |
| 2005/0233504 A1* | 10/2005 | Doi | H01L 21/6835 | 438/127 |
| 2006/0157717 A1* | 7/2006 | Nagai | H01L 33/22 | 257/81 |
| 2006/0169993 A1* | 8/2006 | Fan | H01L 27/153 | 257/88 |
| 2006/0202219 A1* | 9/2006 | Ohashi | H01L 33/20 | 257/98 |
| 2006/0278886 A1* | 12/2006 | Tomoda | H01L 33/20 | 257/99 |
| 2006/0279962 A1 | 12/2006 | Loh | | |
| 2008/0006836 A1* | 1/2008 | Lee | H01L 33/387 | 257/98 |
| 2008/0006838 A1* | 1/2008 | Hattori | H01L 33/20 | 257/103 |
| 2008/0029761 A1* | 2/2008 | Peng | H01L 33/486 | 257/43 |
| 2008/0035949 A1* | 2/2008 | Fudeta | H01L 33/0079 | 257/99 |
| 2008/0043793 A1* | 2/2008 | Ueki | H01S 5/18311 | 372/38.05 |
| 2009/0008654 A1* | 1/2009 | Nagai | H01L 25/0753 | 257/88 |
| 2009/0173952 A1* | 7/2009 | Takeuchi | H01L 33/0079 | 257/79 |
| 2009/0267085 A1* | 10/2009 | Lee | F21K 9/00 | 257/88 |
| 2010/0072905 A1* | 3/2010 | Kim | H05B 33/0821 | 315/192 |
| 2010/0109026 A1* | 5/2010 | Onushkin | H01L 27/156 | 257/88 |
| 2010/0230685 A1* | 9/2010 | Cho | H01L 33/20 | 257/76 |
| 2010/0230705 A1* | 9/2010 | Jeong | H01L 33/42 | 257/98 |
| 2010/0314642 A1* | 12/2010 | Kudo | H01L 33/0079 | 257/98 |
| 2011/0001120 A1* | 1/2011 | Jiang | H01L 21/6835 | 257/13 |
| 2011/0133234 A1* | 6/2011 | Jeong | H01L 27/15 | 257/98 |
| 2011/0140078 A1* | 6/2011 | Hsu | H01L 25/0753 | 257/13 |
| 2011/0147704 A1* | 6/2011 | Jiang | H01L 33/44 | 257/13 |
| 2011/0198647 A1* | 8/2011 | Kazama | H01L 33/20 | 257/98 |
| 2011/0210362 A1* | 9/2011 | Lee | H01L 33/382 | 257/98 |
| 2012/0007118 A1* | 1/2012 | Choi | H01L 33/382 | 257/98 |
| 2012/0138993 A1* | 6/2012 | Kim | H01L 33/04 | 257/98 |
| 2012/0193654 A1* | 8/2012 | Jeong | H01L 27/153 | 257/88 |
| 2013/0015465 A1* | 1/2013 | Lee | H01L 33/40 | 257/76 |
| 2013/0056757 A1* | 3/2013 | Miyachi | H01L 27/153 | 257/88 |
| 2013/0056789 A1 | 3/2013 | Jeong | | |
| 2013/0087814 A1* | 4/2013 | Moon | H01L 33/64 | 257/88 |
| 2013/0146936 A1* | 6/2013 | Tsai | H01L 33/38 | 257/99 |
| 2014/0034980 A1* | 2/2014 | Kazama | H01L 33/22 | 257/98 |
| 2014/0042473 A1* | 2/2014 | Sung | H01L 33/60 | 257/98 |
| 2015/0048380 A1* | 2/2015 | Koike | H01L 33/22 | 257/76 |
| 2015/0063393 A1* | 3/2015 | Iwata | H01S 5/183 | 372/45.01 |
| 2015/0063394 A1* | 3/2015 | Iwata | H01S 5/183 | 372/45.01 |
| 2015/0116985 A1* | 4/2015 | Bang | F21V 23/001 | 362/97.1 |
| 2015/0137169 A1* | 5/2015 | Chen | H01L 33/38 | 257/99 |
| 2015/0171297 A1* | 6/2015 | Rhee | F21K 9/50 | 362/231 |
| 2016/0064611 A1* | 3/2016 | Choi | H01L 33/382 | 257/98 |
| 2016/0087149 A1* | 3/2016 | Miyachi | H01L 25/0753 | 362/509 |

(56) References Cited

U.S. PATENT DOCUMENTS

| | | | |
|---|---|---|---|
| 2016/0126224 A1* | 5/2016 | Lee | H01L 33/38 |
| | | | 257/89 |
| 2016/0276538 A1* | 9/2016 | Zhao | H01L 33/385 |
| 2016/0300745 A1* | 10/2016 | Chang | H01L 25/0753 |
| 2016/0315068 A1* | 10/2016 | Lee | H01L 25/0753 |
| 2016/0351764 A1* | 12/2016 | Cha | H01L 33/58 |
| 2017/0117257 A1* | 4/2017 | Lee | H01L 25/0753 |

* cited by examiner 1156 1020 1010 1030

1158

DISPLAY DEVICE USING SEMICONDUCTOR LIGHT EMITTING DEVICE AND METHOD FOR MANUFACTURING THE SAME

CROSS-REFERENCE TO RELATED APPLICATIONS

This application claims the benefit of priority to Korean Patent Application No. 10-2015-0148965, filed on Oct. 26, 2015, the contents of which is herein expressly incorporated by reference in its entirety.

BACKGROUND OF THE INVENTION

1. Field of the Invention

The present disclosure relates to a display device and a fabrication method thereof, and more particularly, to a flexible display device using a semiconductor light emitting device.

2. Description of the Related Art

In recent years, display devices having excellent characteristics such as low profile, flexibility and the like have been developed in the display technical field. On the contrary, currently commercialized main displays are represented by liquid crystal displays (LCDs) and active matrix organic light emitting diodes (AMOLEDs). However, there exist problems such as a slow response time, difficult implementation of flexibility in case of LCDs, and there exist drawbacks such as short life span, poor yield as well as low flexibility in case of AMOLEDs.

Further, light emitting diodes (LEDs) are well known light emitting devices for converting an electrical current to light, and have been used as a light source for displaying an image in an electronic device including information communication devices since red LEDs using GaAsP compound semiconductors were made commercially available in 1962, together with a GaP:N-based green LEDs. Accordingly, the semiconductor light emitting devices may be used to implement a flexible display, thereby presenting a scheme for solving the problems.

The need of enhancing the light emitting efficiency of the semiconductor light emitting device exists for a flexible display using the semiconductor light emitting device. For the enhancement of light emitting efficiency as described above, a portion on which a light emitting surface is hidden by a wiring electrode connected to the semiconductor light emitting device should be minimized. On the contrary, a contact surface on which the wiring electrode is electrically contacted with the semiconductor light emitting device should be secured to the maximum extent.

SUMMARY OF THE INVENTION

An aspect of the present disclosure is to provide a structure of enhancing luminance in a display device and a fabrication method thereof.

Another aspect of the present disclosure is to reduce an operating voltage of semiconductor light emitting devices as well as enhancing a light emitting efficiency thereof.

According to a display device in accordance with the present disclosure, in a display device having a plurality of semiconductor light emitting devices, at least one of the semiconductor light emitting devices may include a first conductive semiconductor layer, a second conductive semiconductor layer configured to overlap with the first conductive semiconductor layer, and an active layer disposed between the first conductive semiconductor layer and the second conductive semiconductor layer, wherein a recess groove is formed on at least part of the second conductive semiconductor layer, wherein the recess groove includes a bottom portion and a lateral wall portion, and wherein the lateral wall portion is formed along an edge of the second conductive semiconductor layer for surrounding the bottom portion.

According to an embodiment, at least part of a wiring electrode for supplying an electrical signal to the semiconductor light emitting devices may be disposed on the recess groove. The wiring electrode can be formed to cover at least part of the lateral wall portion. The lateral wall portion may include a pair of lateral walls in parallel to each other, and the wiring electrode may be configured to cover either one of the pair of lateral walls but does not cover the other one thereof.

According to an embodiment, the first conductive semiconductor layer may be a p-type GaN layer, and the second conductive semiconductor layer may be an n-type GaN layer, and the recess groove may be a portion from which at least part of the n-type GaN layer is etched.

According to an embodiment, at least one of the semiconductor light emitting devices may further include an undoped semiconductor layer formed to cover the second conductive semiconductor layer, and the recess groove may be recessed toward the first conductive semiconductor layer on one surface of the undoped semiconductor layer.

According to an embodiment, a surface of the bottom portion can be formed with an unevenness. The lateral wall portion may be configured to be inclined with respect to a direction perpendicular to the bottom portion.

Furthermore, the present disclosure discloses a semiconductor light emitting device including a first conductive semiconductor layer, a second conductive semiconductor layer configured to overlap with the first conductive semiconductor layer, and an active layer disposed between the first conductive semiconductor layer and the second conductive semiconductor layer, wherein a recess groove is formed on at least part of the second conductive semiconductor layer, and the recess groove is formed on a bottom portion and along an edge of the second conductive semiconductor layer to have a lateral wall portion for surrounding the bottom portion.

Furthermore, the present disclosure discloses a fabrication method of a display device, and the fabrication method may include sequentially growing a second conductive semiconductor layer, an active layer and a first conductive semiconductor layer on a substrate to deposit a first conductive semiconductor layer, an active layer, a second conductive semiconductor layer thereon, etching the first conductive semiconductor layer, active layer and second conductive semiconductor layer to isolate semiconductor light emitting devices from the substrate, separating the semiconductor light emitting device from the substrate, forming a recess groove on the second conductive semiconductor layer through etching, and electrically connecting a second conductive semiconductor layer formed on the recess groove to a wiring electrode.

According to a display device in accordance with the present disclosure, it is possible to increase a contact area between the wiring electrode and the semiconductor light emitting devices due to a well-type structure. Thus, it is possible to reduce an operating voltage of the semiconductor light emitting devices as well as improve a light extraction efficiency thereof. Accordingly, it is possible to greatly enhance the luminance of the display device.

Furthermore, according to the present disclosure, a recess groove can be formed on one surface of the semiconductor light emitting devices, thereby implementing the luminance enhancement of the display device though it is a simple fabrication process.

Furthermore, according to the present disclosure, it is possible to implement a wiring electrode connecting structure capable of securing reliability even at a process margin of the semiconductor light emitting device having a size of the micro-unit.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Figure 1:
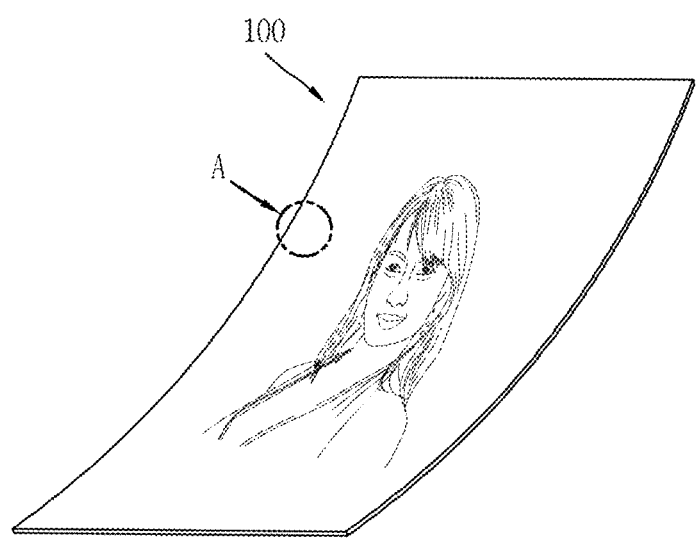
FIG. 1 is a conceptual view illustrating a display device using a semiconductor light emitting device according to an embodiment of the present disclosure.

Hereinafter, the embodiments disclosed herein will be described in detail with reference to the accompanying drawings, and the same or similar elements are designated with the same numeral references regardless of the numerals in the drawings and their redundant description will be omitted. A suffix "module" or "unit" used for constituent elements disclosed in the following description is merely intended for easy description of the specification, and the suffix itself does not give any special meaning or function. Also, it should be noted that the accompanying drawings are merely illustrated to easily explain the concept of the invention, and therefore, they should not be construed to limit the technological concept disclosed herein by the accompanying drawings.

Furthermore, when an element such as a layer, region or substrate is referred to as being "on" another element, it can be directly on the other element or an intermediate element may also be interposed therebetween.

A display device disclosed herein may include a portable phone, a smart phone, a laptop computer, a digital broadcast terminal, a personal digital assistant (PDA), a portable multimedia player (PMP), a navigation, a slate PC, a tablet PC, an ultrabook, a digital TV, a desktop computer, and the like. However, it would be easily understood by those skilled in the art that a configuration disclosed herein may be applicable to any displayable device even though it is a new product type which will be developed later.

FIG. 1 is a conceptual view illustrating a display device using a semiconductor light emitting device according to an embodiment of the present disclosure. According to the drawing, information processed in the controller of the display device 100 can be displayed using a flexible display. The flexible display may include a flexible, bendable, twistable, foldable and rollable display. For example, the flexible display can be a display fabricated on a thin and flexible substrate that can be warped, bent, folded or rolled like a paper sheet while maintaining the display characteristics of a flat display in the related art.

A display area of the flexible display becomes a plane in a configuration that the flexible display is not warped (for example, a configuration having an infinite radius of curvature, hereinafter, referred to as a "first configuration"). The display area thereof becomes a curved surface in a configuration that the flexible display is warped by an external force in the first configuration (for example, a configuration having a finite radius of curvature, hereinafter, referred to as a "second configuration"). As illustrated in the drawing, information displayed in the second configuration may be visual information displayed on a curved surface. The visual information may be implemented by individually controlling the light emission of sub-pixels disposed in a matrix form. The sub-pixel denotes a minimum unit for implementing one color.

The sub-pixel of the flexible display can be implemented by a semiconductor light emitting device. According to the present disclosure, a light emitting diode (LED) is illustrated as a type of semiconductor light emitting device. The light emitting diode can be formed with a small size to perform the role of a sub-pixel even in the second configuration.

Hereinafter, a flexible display implemented using the light emitting diode will be described in more detail with reference to the accompanying drawings. In particular, FIG. 2 is a partial enlarged view of portion "A" in FIG. 1, FIGS. 3A and 3B are cross-sectional views taken along lines B-B and C-C in FIG. 2, FIG. 4 is a conceptual view illustrating a flip-chip type semiconductor light emitting device in FIG. 3A, and FIGS. 5A through 5C are conceptual views illustrating various forms for implementing colors in connection with a flip-chip type semiconductor light emitting device.

Figure 2:
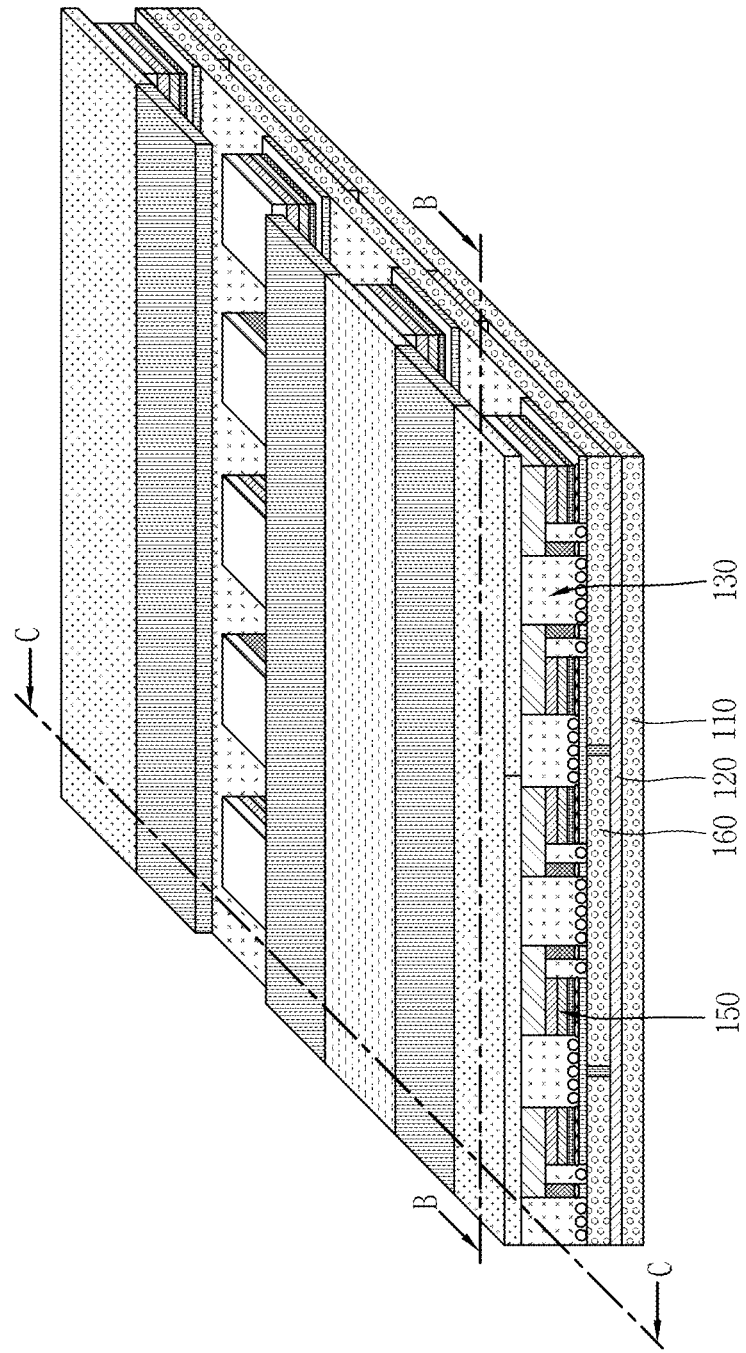
FIG. 2 is a partial enlarged view of portion "A" in FIG. 1, and FIGS. 3A and 3B are cross-sectional views taken along lines B-B and C-C in FIG. 2.
Figure 3A:
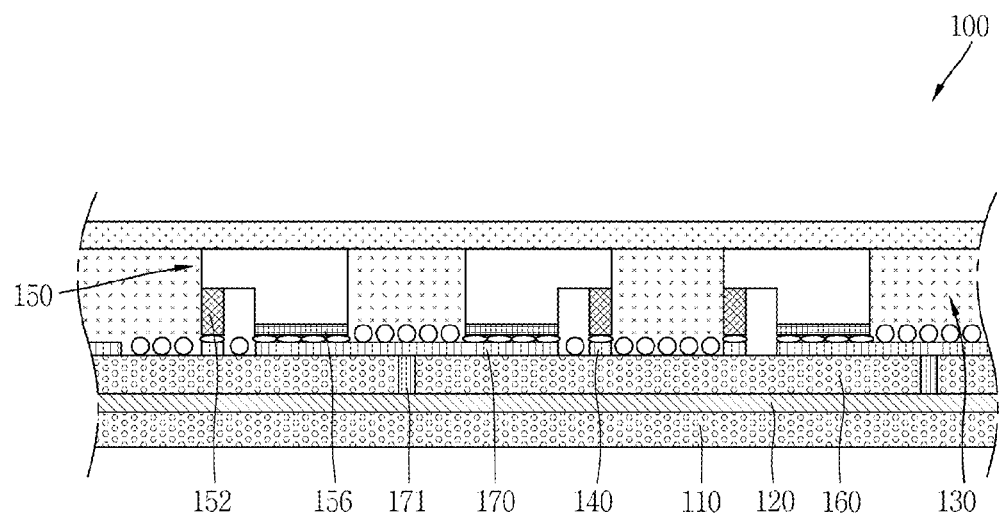
Figure 3B:
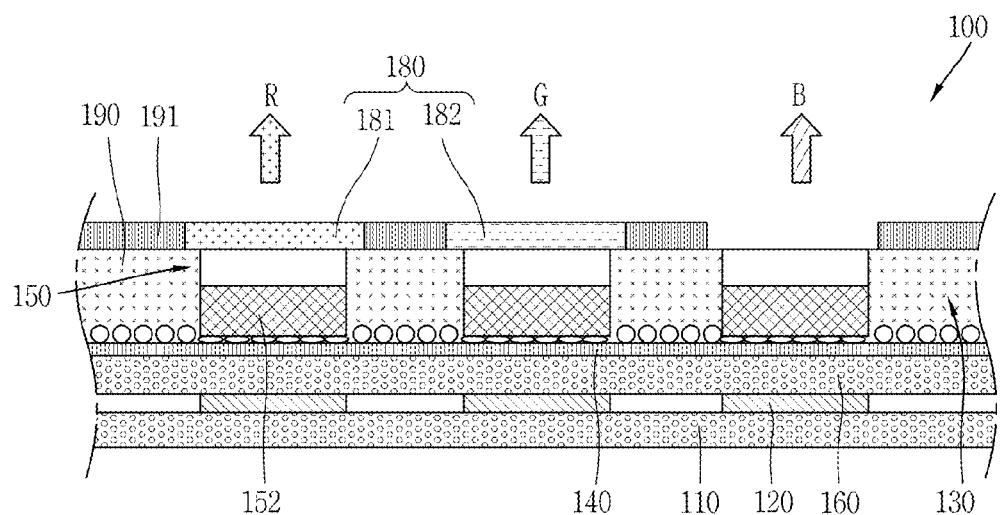
Figure 4:
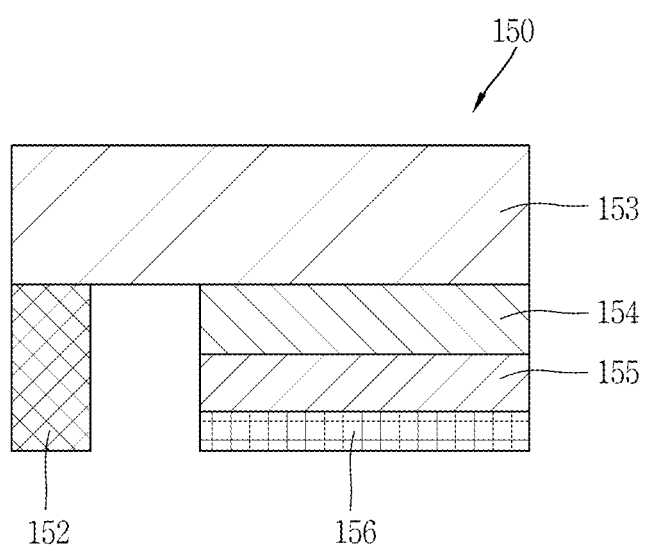
FIG. 4 is a conceptual view illustrating a flip-chip type semiconductor light emitting device in FIG. 3A.

FIGS. 2, 3A and 3B illustrate a display device 100 using a passive matrix (PM) type semiconductor light emitting device. However, the following illustration may be also applicable to an active matrix (AM) type semiconductor light emitting device. As shown, the display device 100 includes a substrate 110, a first electrode 120, a conductive adhesive layer 130, a second electrode 140, and a plurality of semiconductor light emitting devices 150.

The substrate 110 may be a flexible substrate. The substrate 110 may contain glass or polyimide (PI) to implement the flexible display device. In addition, if it is a flexible material, any one such as polyethylene naphthalate (PEN), polyethylene terephthalate (PET) or the like may be used. Furthermore, the substrate 110 can be either one of transparent and non-transparent materials. The substrate 110 may be a wiring substrate disposed with the first electrode 120, and thus the first electrode 120 may be placed on the substrate 110.

According to the drawing, an insulating layer 160 is disposed on the substrate 110 placed with the first electrode 120, and an auxiliary electrode 170 may be placed on the insulating layer 160. In this instance, a configuration in which the insulating layer 160 is deposited on the substrate 110 may be a single wiring substrate. More specifically, the insulating layer 160 may be incorporated into the substrate 110 with an insulating and flexible material such as polyimide (PI), PET, PEN or the like to form single wiring substrate.

Further, the auxiliary electrode 170 as an electrode for electrically connecting the first electrode 120 to the semiconductor light emitting device 150 is placed on the insulating layer 160, and disposed to correspond to the location of the first electrode 120. For example, the auxiliary electrode 170 has a dot shape, and can be electrically connected to the first electrode 120 by an electrode hole 171 passing through the insulating layer 160. The electrode hole 171 can be formed by filling a conductive material in a via hole.

Referring to the drawings, the conductive adhesive layer 130 can be formed on one surface of the insulating layer 160, but the present disclosure is not limited to this. For example, it is possible to also have the conductive adhesive layer 130 disposed on the substrate 110 with no insulating layer 160. The conductive adhesive layer 130 may perform the role of an insulating layer in the structure in which the conductive adhesive layer 130 is disposed on the substrate 110.

In addition, the conductive adhesive layer 130 can have adhesiveness and conductivity, and a conductive material and an adhesive material may be mixed on the conductive adhesive layer 130. Furthermore, the conductive adhesive layer 130 may have flexibility, thereby allowing a flexible function in the display device.

For example, the conductive adhesive layer 130 may be an anisotropic conductive film (ACF), an anisotropic conductive paste, a solution containing conductive particles, and the like. The conductive adhesive layer 130 allows electrical interconnection in the z-direction passing through the thickness thereof, but may be configured as a layer having electrical insulation in the horizontal x-y direction thereof. Accordingly, the conductive adhesive layer 130 may be referred to as a z-axis conductive layer (hereinafter referred to as a "conductive adhesive layer").

The anisotropic conductive film is a film with a form in which an anisotropic conductive medium is mixed with an insulating base member, and thus when heat and pressure are applied thereto, only a specific portion thereof may have conductivity by the anisotropic conductive medium. Hereinafter, heat and pressure are applied to the anisotropic conductive film, but other methods may be also available for the anisotropic conductive film to partially have conductivity. The methods may include applying only either one of heat and pressure thereto, UV curing, and the like.

Furthermore, the anisotropic conductive medium can be conductive balls or particles. According to the drawing, in the present embodiment, the anisotropic conductive film includes an anisotropic conductive medium mixed with an insulating base member, and thus when heat and pressure are applied thereto, only a specific portion thereof can have conductivity by the conductive balls. The anisotropic conductive film may be in a state in which a core with a conductive material contains a plurality of particles coated by an insulating layer with a polymer material, and can have conductivity by the core while breaking an insulating layer on a portion to which heat and pressure are applied. Here, a core may be transformed to implement a layer having both surfaces to which objects contact in the thickness direction of the film.

In a more specific example, heat and pressure are applied to an anisotropic conductive film as a whole, and electrical connection in the z-axis direction is partially formed by a height difference from a mating object adhered by the use of the anisotropic conductive film. In another example, an anisotropic conductive film may include a plurality of particles in which a conductive material is coated on insulating cores. Further, a portion to which heat and pressure are applied can be converted (pressed and adhered) to a conductive material to have conductivity in the thickness direction of the film. In still another example, it can be formed to have conductivity in the thickness direction of the film in which a conductive material passes through an insulating base member in the z-direction. In this instance, the conductive material may have a pointed end portion.

According to the drawing, the anisotropic conductive film may be a fixed array anisotropic conductive film (ACF) configured with a form in which conductive balls are inserted into one surface of the insulating base member. More specifically, the insulating base member is formed of an adhesive material, and the conductive balls are intensively disposed at a bottom portion of the insulating base member, and when heat and pressure are applied thereto, the base member is modified along with the conductive balls, thereby having conductivity in the vertical direction thereof.

However, the present disclosure is not limited to this, and the anisotropic conductive film can have a form in which conductive balls are randomly mixed with an insulating base member or a form configured with a plurality of layers in which conductive balls are disposed at any one layer (double-ACF), and the like. The anisotropic conductive paste as a form coupled to a paste and conductive balls may be a paste in which conductive balls are mixed with an insulating and adhesive base material. Furthermore, a solution containing conductive particles may be a solution in a form containing conductive particles or nano particles.

Referring to the drawing again, the second electrode 140 is located at the insulating layer 160 to be separated from the auxiliary electrode 170. In other words, the conductive adhesive layer 130 is disposed on the insulating layer 160 located with the auxiliary electrode 170 and second electrode 140. When the conductive adhesive layer 130 is formed in a state that the auxiliary electrode 170 and second electrode 140 are located, and then the semiconductor light emitting device 150 is connect thereto in a flip chip form with the application of heat and pressure, the semiconductor light emitting device 150 is electrically connected to the first electrode 120 and second electrode 140.

Referring to FIG. 4, the semiconductor light emitting device may be a flip chip type semiconductor light emitting device. For example, the semiconductor light emitting device may include a p-type electrode 156, a p-type semiconductor layer 155 formed with the p-type electrode 156, an active layer 154 formed on the p-type semiconductor layer 155, an n-type semiconductor layer 153 formed on the active layer 154, and an n-type electrode 152 disposed to be separated from the p-type electrode 156 in the horizontal direction on the n-type semiconductor layer 153. In this instance, the p-type electrode 156 can be electrically connected to the welding portion 179 by the conductive adhesive layer 130, and the n-type electrode 152 can be electrically connected to the second electrode 140.

Referring to FIGS. 2, 3A and 3B again, the auxiliary electrode 170 can be formed in an elongated manner in one direction to be electrically connected to a plurality of semiconductor light emitting devices 150. For example, the left and right p-type electrodes of the semiconductor light emitting devices around the auxiliary electrode can be electrically connected to one auxiliary electrode.

More specifically, the semiconductor light emitting device 150 is pressed into the conductive adhesive layer 130, and only a portion between the p-type electrode 156 and auxiliary electrode 170 of the semiconductor light emitting device 150 and a portion between the n-type electrode 152 and second electrode 140 of the semiconductor light emitting device 150 have conductivity, and the remaining portion does not have conductivity since there is no push-down of the semiconductor light emitting device. Furthermore, a plurality of semiconductor light emitting devices 150 constitute a light-emitting array, and a phosphor layer 180 is formed on the light-emitting array.

The light emitting device may include a plurality of semiconductor light emitting devices with different self luminance values. Each of the semiconductor light emitting devices 150 constitutes a sub-pixel, and is electrically connected to the first electrode 120. For example, there may exist a plurality of first electrodes 120, and the semiconductor light emitting devices are arranged in several rows, for instance, and each row of the semiconductor light emitting devices can be electrically connected to any one of the plurality of first electrodes.

Furthermore, the semiconductor light emitting devices may be connected in a flip chip form, and thus semiconductor light emitting devices grown on a transparent dielectric substrate. Furthermore, the semiconductor light emitting devices may be nitride semiconductor light emitting devices, for instance. The semiconductor light emitting device 150 has an excellent luminance characteristic, and thus it is possible to configure individual sub-pixels even with a small size thereof.

According to the drawing, a partition wall 190 can be formed between the semiconductor light emitting devices 150. In this instance, the partition wall 190 divides individual sub-pixels from one another, and be formed as an integral body with the conductive adhesive layer 130. For example, a base member of the anisotropic conductive film may form the partition wall when the semiconductor light emitting device 150 is inserted into the anisotropic conductive film.

Furthermore, when the base member of the anisotropic conductive film is black, the partition wall 190 has reflective characteristics while at the same time increasing contrast with no additional black insulator. In another example, a reflective partition wall can be separately provided with the partition wall 190. In this instance, the partition wall 190 may include a black or white insulator according to the purpose of the display device. This enhances reflectivity when the partition wall of the while insulator is used, and increase contrast while at the same time having reflective characteristics.

Further, the phosphor layer 180 can be located at an outer surface of the semiconductor light emitting device 150. For example, the semiconductor light emitting device 150 is a blue semiconductor light emitting device that emits blue (B) light, and the phosphor layer 180 performs the role of converting the blue (B) light into the color of a sub-pixel. The phosphor layer 180 may be a red phosphor layer 181 or green phosphor layer 182 constituting individual pixels.

In other words, a red phosphor 181 capable of converting blue light into red (R) light can be deposited on the blue semiconductor light emitting device 151 at a location implementing a red sub-pixel, and a green phosphor 182 capable of converting blue light into green (G) light can be deposited on the blue semiconductor light emitting device 151 at a location implementing a green sub-pixel. Furthermore, only the blue semiconductor light emitting device 151 may be solely used at a location implementing a blue sub-pixel. In this instance, the red (R), green (G) and blue (B) sub-pixels may implement one pixel. More specifically, one color phosphor can be deposited along each line of the first electrode 120. Accordingly, one line on the first electrode 120 may be an electrode controlling one color. In other words, red (R), green (B) and blue (B) may be sequentially disposed, thereby implementing sub-pixels.

However, the present disclosure is not limited to this, and the semiconductor light emitting device 150 may be combined with a quantum dot (QD) instead of a phosphor to implement sub-pixels such as red (R), green (G) and blue (B). Furthermore, a black matrix 191 may be disposed between each phosphor layer to enhance contrast. In other words, the black matrix 191 can enhance the contrast of luminance. However, the present disclosure is not limited to this, and another structure for implementing blue, red and green may be also applicable thereto.

Figure 5A:
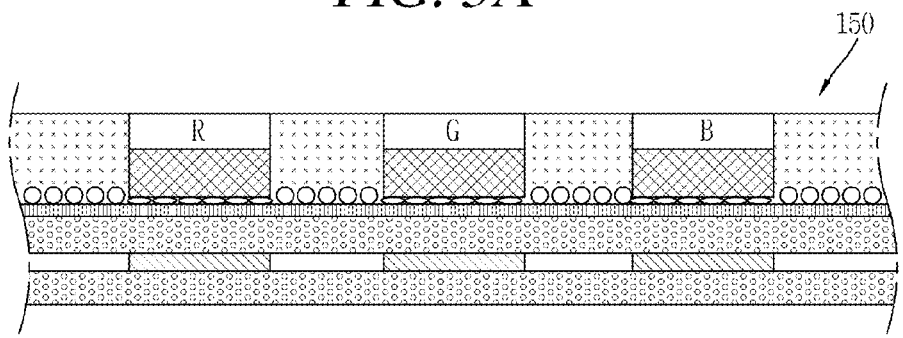
FIGS. 5A through 5C are conceptual views illustrating various forms for implementing colors in connection with a flip-chip type semiconductor light emitting device.

Referring to FIG. 5A, each of the semiconductor light emitting devices 150 may be implemented with a high-power light emitting device that emits various lights including blue in which gallium nitride (GaN) is mostly used, and indium (In) and or aluminum (Al) are added thereto. In this instance, the semiconductor light emitting device 150 may be red, green and blue semiconductor light emitting devices, respectively, to implement each sub-pixel. For instance, red, green and blue semiconductor light emitting devices (R, G, B) are alternately disposed, and red, green and blue sub-pixels implement one pixel by the red, green and blue semiconductor light emitting devices, thereby implementing a full color display.

Figure 5B:
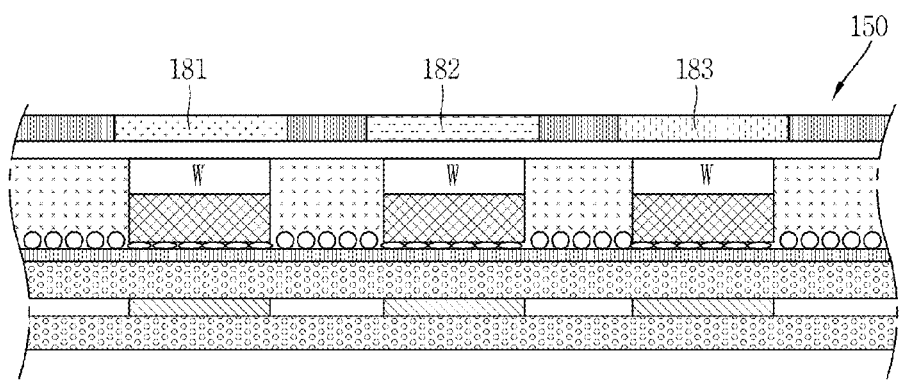

Referring to FIG. 5B, the semiconductor light emitting device has a white light emitting device (W) provided with a yellow phosphor layer for each element. In this instance, a red phosphor layer 181, a green phosphor layer 182 and blue phosphor layer 183 can be provided on the white light emitting device (W) to implement a sub-pixel. Furthermore, a color filter repeated with red, green and blue on the white light emitting device (W) may be used to implement a sub-pixel.

Figure 5C:
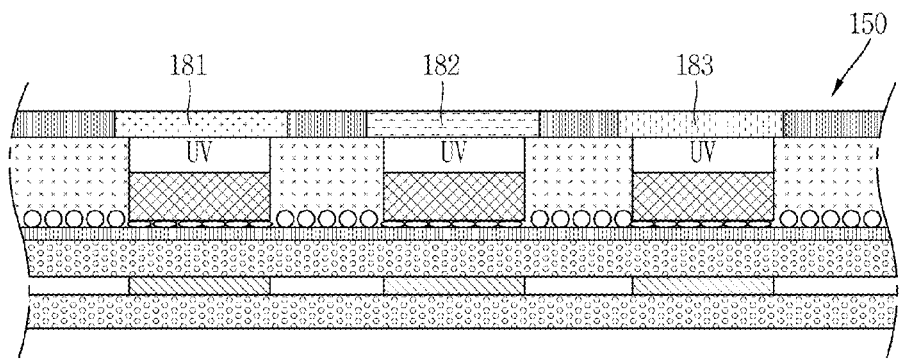

Referring to FIG. 5C, it is possible to also have a structure in which a red phosphor layer 181, a green phosphor layer 182 and blue phosphor layer 183 are provided on a ultra violet light emitting device (UV). Thus, the semiconductor light emitting device can be used over the entire region up to ultra violet (UV) as well as visible light, and be extended to a form of semiconductor light emitting device in which ultra violet (UV) can be used as an excitation source.

Taking the present example into consideration again, the semiconductor light emitting device 150 is placed on the conductive adhesive layer 130 to configure a sub-pixel in the display device. The semiconductor light emitting device 150 has excellent luminance characteristics, and thus it is possible to configure individual sub-pixels even with a small size thereof. The size of the individual semiconductor light emitting device 150 can be less than 80 µm in the length of one side thereof, and formed with a rectangular or square shaped element. For a rectangular shaped element, the size thereof can be less than 20×80 µm.

Furthermore, even when a square shaped semiconductor light emitting device 150 with a length of side of 10 µm is used for a sub-pixel, it will exhibit a sufficient brightness for implementing a display device. Accordingly, for a rectangular pixel in which one side of a sub-pixel is 600 µm in size, and the remaining one side thereof is 300 µm, a relative distance between the semiconductor light emitting devices becomes sufficiently large. Accordingly, it is possible to implement a flexible display device having a HD image quality.

Figure 6:
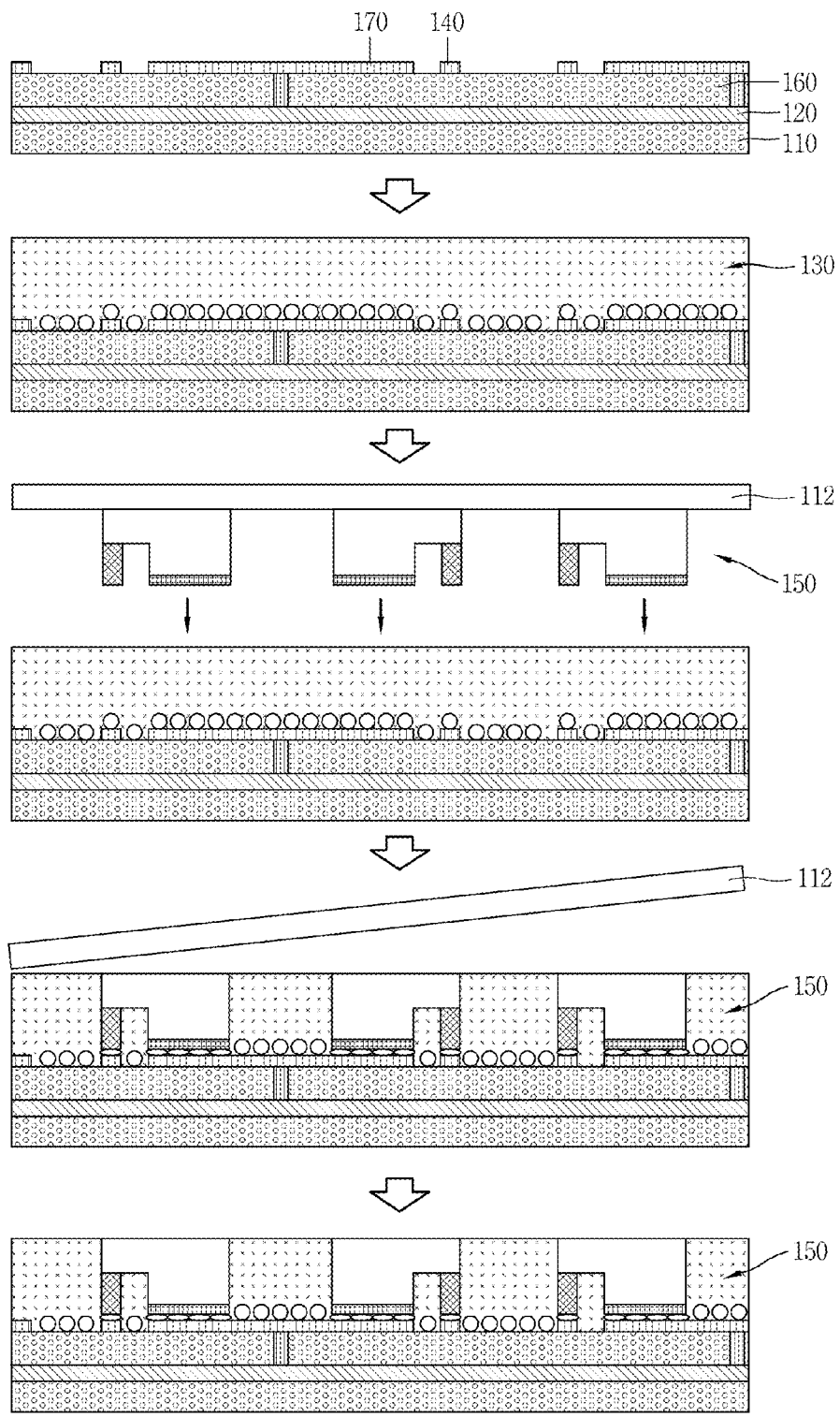
FIG. 6 is cross-sectional views illustrating a fabrication method of a display device using a semiconductor light emitting device according to the present disclosure.

A display device using the foregoing semiconductor light emitting device will be fabricated by a new type of fabrication method. Hereinafter, the fabrication method will be described with reference to FIG. 6. In particular, FIG. 6 is cross-sectional views illustrating a method of fabricating a display device using a semiconductor light emitting device according to the present disclosure.

Referring to the drawing, first, the conductive adhesive layer 130 is formed on the insulating layer 160 located with the auxiliary electrode 170 and second electrode 140. The insulating layer 160 is deposited on the first substrate 110 to form one substrate (or wiring substrate), and the first electrode 120, auxiliary electrode 170 and second electrode 140 are disposed at the wiring substrate. In this instance, the first electrode 120 and second electrode 140 may be disposed in a perpendicular direction to each other. Furthermore, the first substrate 110 and insulating layer 160 may contain glass or polyimide (PI), respectively, to implement a flexible display device.

The conductive adhesive layer 130 may be implemented by an anisotropic conductive film, for example, and an anisotropic conductive film may be coated on a substrate located with the insulating layer 160. Next, a second substrate 112 located with a plurality of semiconductor light emitting devices 150 corresponding to the location of the auxiliary electrodes 170 and second electrodes 140 and constituting individual pixels is disposed such that the semiconductor light emitting device 150 faces the auxiliary electrode 170 and second electrode 140.

In this instance, the second substrate 112 as a growth substrate for growing the semiconductor light emitting device 150 may be a sapphire substrate or silicon substrate. Further, the semiconductor light emitting device has a gap and size capable of implementing a display device when formed in the unit of wafer, and thus effectively used for a display device.

Next, the wiring substrate is thermally compressed to the second substrate 112. For example, the wiring substrate and second substrate 112 may be thermally compressed to each other by applying an ACF press head. The wiring substrate and second substrate 112 are bonded to each other using the thermal compression. Only a portion between the semiconductor light emitting device 150 and the auxiliary electrode 170 and second electrode 140 has conductivity due to the characteristics of an anisotropic conductive film having conductivity by thermal compression, thereby allowing the electrodes and semiconductor light emitting device 150 to be electrically connected to each other. At this time, the semiconductor light emitting device 150 may be inserted into the anisotropic conductive film, thereby forming a partition wall between the semiconductor light emitting devices 150.

Next, the second substrate 112 is removed. For example, the second substrate 112 may be removed using a laser lift-off (LLO) or chemical lift-off (CLO) method. Finally, the second substrate 112 is removed to expose the semiconductor light emitting devices 150 to the outside. Silicon oxide (SiOx) or the like may be coated on the wiring substrate coupled to the semiconductor light emitting device 150 to form a transparent insulating layer.

Forming a phosphor layer on one surface of the semiconductor light emitting device 150 can also be provided. For example, the semiconductor light emitting device 150 may be a blue semiconductor light emitting device for emitting blue (B) light, and red or green phosphor for converting the blue (B) light into the color of the sub-pixel may form a layer on one surface of the blue semiconductor light emitting device.

The fabrication method or structure of a display device using the foregoing semiconductor light emitting device can be modified in various forms. For example, the foregoing display device may be applicable to a vertical semiconductor light emitting device. Hereinafter, the vertical structure will be described with reference to FIGS. 5 and 6.

Figure 7:
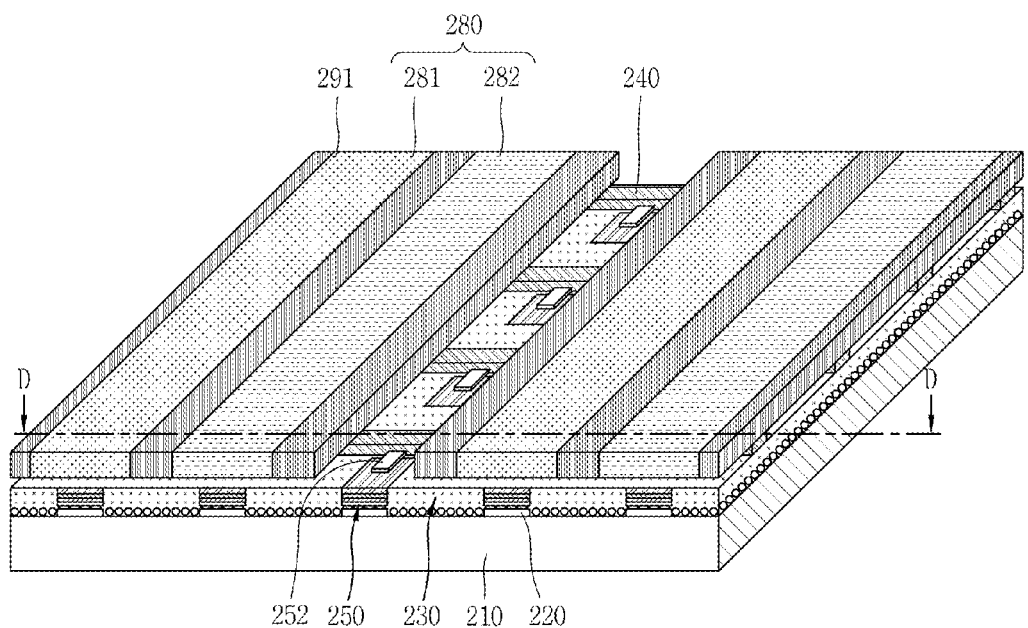
FIG. 7 is a perspective view illustrating a display device using a semiconductor light emitting device according to another embodiment of the present disclosure.
Figure 8:
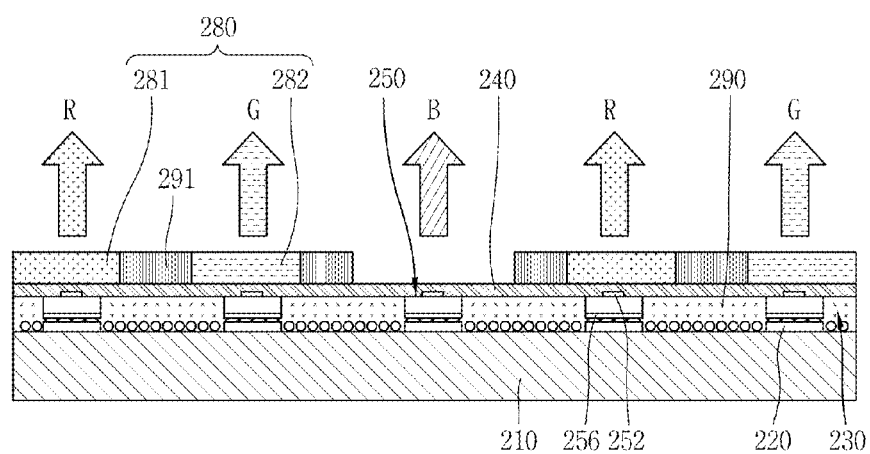
FIG. 8 is a cross-sectional view taken along line D-D in FIG. 7.
Figure 9:
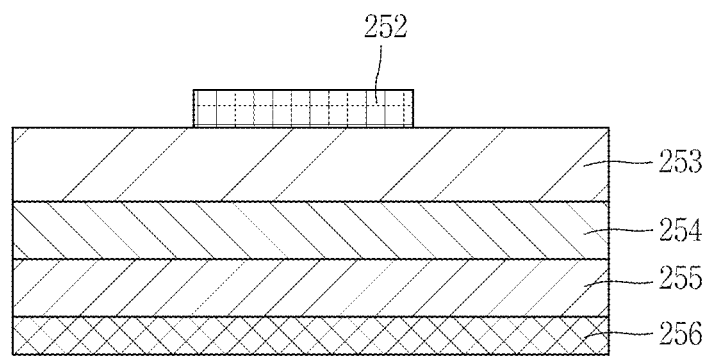
FIG. 9 is a conceptual view illustrating a vertical type semiconductor light emitting device in FIG. 8.

FIG. 7 is a perspective view illustrating a display device using a semiconductor light emitting device according to another embodiment of the present disclosure, FIG. 8 is a cross-sectional view taken along line C-C in FIG. 7, and FIG. 9 is a conceptual view illustrating a vertical type semiconductor light emitting device in FIG. 8. According to the drawings, the display device is using a passive matrix (PM) type of vertical semiconductor light emitting device.

As shown, the display device includes a substrate 210, a first electrode 220, a conductive adhesive layer 230, a second electrode 240 and a plurality of semiconductor light emitting devices 250. The substrate 210 as a wiring substrate disposed with the first electrode 220 may include polyimide (PI) to implement a flexible display device. In addition, any one may be used if it is an insulating and flexible material.

The first electrode 220 can be located on the substrate 210, and formed with a bar-shaped electrode elongated in one direction. The first electrode 220 can perform the role of a data electrode. Further, the conductive adhesive layer 230 is formed on the substrate 210 located with the first electrode 220. Similarly to a display device to which a flip chip type light emitting device is applied, the conductive adhesive layer 230 may be an anisotropic conductive film (ACF), an anisotropic conductive paste, a solution containing conductive particles, and the like. However, the present embodiment illustrates the conductive adhesive layer 230 being implemented by an anisotropic conductive film.

When an anisotropic conductive film is located in a state that the first electrode 220 is located on the substrate 210, and then heat and pressure are applied to connect the semiconductor light emitting device 250 thereto, the semiconductor light emitting device 250 is electrically connected to the first electrode 220. At this time, the semiconductor light emitting device 250 may be preferably disposed on the first electrode 220.

Further, the electrical connection is generated because an anisotropic conductive film partially has conductivity in the thickness direction when heat and pressure are applied as described above. Accordingly, the anisotropic conductive film is partitioned into a portion 231 having conductivity and a portion 232 having no conductivity in the thickness direction thereof. Furthermore, the anisotropic conductive film contains an adhesive component, and thus the conductive adhesive layer 230 implements a mechanical coupling as well as an electrical coupling between the semiconductor light emitting device 250 and the first electrode 220.

Thus, the semiconductor light emitting device 250 is placed on the conductive adhesive layer 230, thereby configuring a separate sub-pixel in the display device. In addition, the semiconductor light emitting device 250 has excellent luminance characteristics, and thus it is possible to configure individual sub-pixels even with a small size thereof. The size of the individual semiconductor light emitting device 250 can be less than 80 μm in the length of one side thereof, and formed with a rectangular or square shaped element.

For a rectangular shaped element, the size thereof can be less than 20×80 μm. The semiconductor light emitting device 250 may be a vertical structure. A plurality of second electrodes 240 disposed in a direction of crossing the length direction of the first electrode 220, and electrically connected to the vertical semiconductor light emitting device 250 can be located between vertical semiconductor light emitting devices.

Referring to FIG. 9, the vertical semiconductor light emitting device may include a p-type electrode 256, a p-type semiconductor layer 255 formed with the p-type electrode 256, an active layer 254 formed on the p-type semiconductor layer 255, an n-type semiconductor layer 253 formed on the active layer 254, and an n-type electrode 252 framed on the n-type semiconductor layer 253. In this instance, the p-type electrode 256 located at the bottom thereof can be electrically connected to the first electrode 220 by the conductive adhesive layer 230, and the n-type electrode 252 located at the top thereof can be electrically connected to the second electrode 240 which will be described later. The electrodes may be disposed in the upward/downward direction in the vertical semiconductor light emitting device 250, thereby providing a great advantage capable of reducing the chip size.

Referring to FIG. 8 again, a phosphor layer 280 can be formed on one surface of the semiconductor light emitting device 250. For example, the semiconductor light emitting device 250 is a blue semiconductor light emitting device 251 that emits blue (B) light, and the phosphor layer 280 for converting the blue (B) light into the color of the sub-pixel may be provided thereon. In this instance, the phosphor layer 280 may be a red phosphor 281 and a green phosphor 282 constituting individual pixels.

In other words, a red phosphor 281 capable of converting blue light into red (R) light can be deposited on the blue semiconductor light emitting device 251 at a location implementing a red sub-pixel, and a green phosphor 282 capable of converting blue light into green (G) light can be deposited on the blue semiconductor light emitting device 251 at a location implementing a green sub-pixel. Furthermore, only the blue semiconductor light emitting device 251 may be solely used at a location implementing a blue sub-pixel.

In this instance, the red (R), green (G) and blue (B) sub-pixels may implement one pixel. However, the present disclosure is not limited to this, and another structure for implementing blue, red and green may be also applicable thereto as described above in a display device to which a flip chip type light emitting device is applied.

Taking the present embodiment into consideration again, the second electrode 240 is located between the semiconductor light emitting devices 250, and electrically connected to the semiconductor light emitting devices 250. For example, the semiconductor light emitting devices 250 may be disposed in a plurality of rows, and the second electrode 240 can be located between the rows of the semiconductor light emitting devices 250.

Since a distance between the semiconductor light emitting devices 250 constituting individual pixels is sufficiently large, the second electrode 240 can be located between the semiconductor light emitting devices 250. The second electrode 240 can be formed with a bar-shaped electrode elongated in one direction, and disposed in a perpendicular direction to the first electrode.

Furthermore, the second electrode 240 can be electrically connected to the semiconductor light emitting device 250 by a connecting electrode protruded from the second electrode 240. More specifically, the connecting electrode may be an n-type electrode of the semiconductor light emitting device 250. For example, the n-type electrode is formed with an ohmic electrode for ohmic contact, and the second electrode covers at least part of the ohmic electrode by printing or deposition. Thus, the second electrode 240 can be electrically connected to the n-type electrode of the semiconductor light emitting device 250.

According to the drawing, the second electrode 240 can be located on the conductive adhesive layer 230. According to circumstances, a transparent insulating layer containing silicon oxide (SiOx) can be formed on the substrate 210 formed with the semiconductor light emitting device 250. When the transparent insulating layer is formed and then the second electrode 240 is placed thereon, the second electrode 240 can be located on the transparent insulating layer. Furthermore, the second electrode 240 can be formed to be separated from the conductive adhesive layer 230 or transparent insulating layer.

If a transparent electrode such as indium tin oxide (ITO) is used to locate the second electrode 240 on the semiconductor light emitting device 250, the ITO material has a problem of bad adhesiveness with an n-type semiconductor. Accordingly, the second electrode 240 may be placed between the semiconductor light emitting devices 250, thereby obtaining an advantage in which the transparent electrode is not required. Accordingly, an n-type semiconductor layer and a conductive material having a good adhesiveness may be used as a horizontal electrode without being restricted by the selection of a transparent material, thereby enhancing the light extraction efficiency.

According to the drawing, a partition wall 290 can be formed between the semiconductor light emitting devices 250. In other words, the partition wall 290 can be disposed between the vertical semiconductor light emitting devices 250 to isolate the semiconductor light emitting device 250 constituting individual pixels. In this instance, the partition wall 290 divides individual sub-pixels from one another, and be formed as an integral body with the conductive adhesive layer 230. For example, a base member of the anisotropic conductive film may form the partition wall when the semiconductor light emitting device 250 is inserted into the anisotropic conductive film.

Furthermore, when the base member of the anisotropic conductive film is black, the partition wall 290 has reflective characteristics while at the same time increasing contrast with no additional black insulator. In another example, a reflective partition wall can be separately provided with the partition wall 290. In this instance, the partition wall 290 may include a black or white insulator according to the purpose of the display device.

If the second electrode 240 is precisely located on the conductive adhesive layer 230 between the semiconductor light emitting devices 250, the partition wall 290 can be located between the semiconductor light emitting device 250 and second electrode 240. Accordingly, individual sub-pixels may be configured even with a small size using the semiconductor light emitting device 250, and a distance between the semiconductor light emitting devices 250 may be relatively sufficiently large to place the second electrode 240 between the semiconductor light emitting devices 250, thereby having the effect of implementing a flexible display device having a HD image quality. Furthermore, according to the drawing, a black matrix 291 can be disposed between each phosphor layer to enhance contrast. In other words, the black matrix 191 can enhance the contrast of luminance.

As described above, the semiconductor light emitting device 250 is located on the conductive adhesive layer 230, thereby constituting individual pixels on the display device. Since the semiconductor light emitting device 250 has excellent luminance characteristics, thereby configuring individual sub-pixels even with a small size thereof. As a result, it is possible to implement a full color display in which the sub-pixels of red (R), green (G) and blue (B) implement one pixel by the semiconductor light emitting device.

In a display device using a semiconductor light emitting device according to the present disclosure as described above, it may be difficult to increase the luminance of the display device due to a small size of the semiconductor light emitting device. Further, there is a limit in increasing luminance because an area of an upper surface (light emitting surface) of emitting light from the semiconductor light emitting device is small. Moreover, in a vertical structure of semiconductor light emitting device, the area of the light emitting surface is reduced because part of the light emitting surface is hidden by a wiring electrode in contact therewith.

In this instance, an upper wiring electrode structure can be determined in consideration of an operating voltage, a light extraction efficiency and a light spreading, and thus a semiconductor light emitting device with several tens of the micro-unit may have a simple rectangular shaped structure due to a process margin. In such a structure, there is a problem of increasing the operating voltage when the area of an upper wiring electrode (or contact area between the wiring electrode and the semiconductor light emitting device) decreases.

Figure 10:
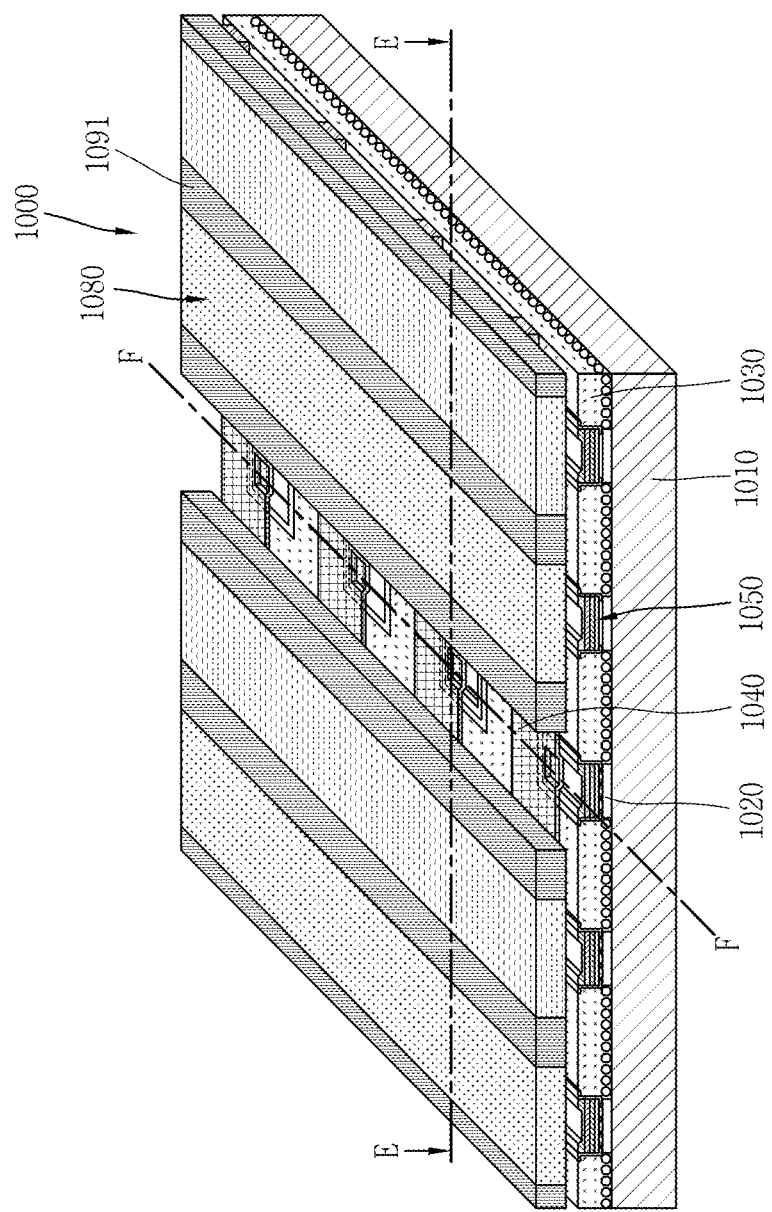
FIG. 10 is an enlarged view illustrating portion "A" in FIG. 1 illustrating another embodiment of the present disclosure to which a new type semiconductor light emitting device is applied.
Figure 11:
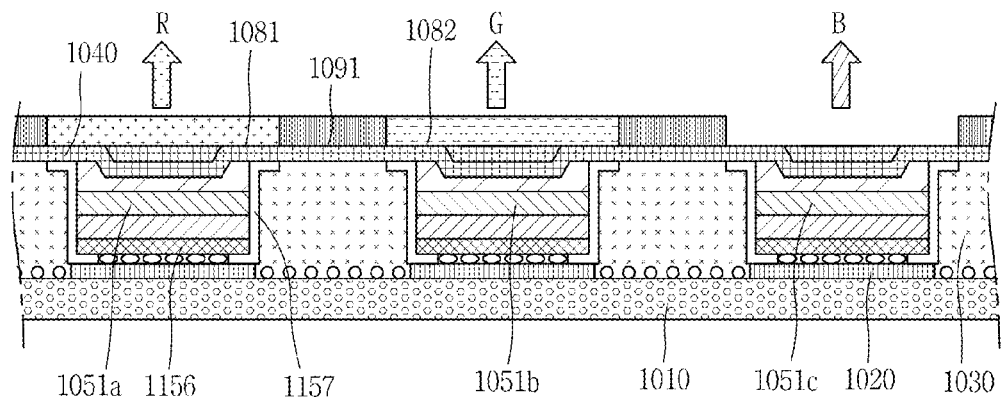
FIG. 11 is a cross-sectional view taken along line E-E in FIG. 10.
Figure 12:
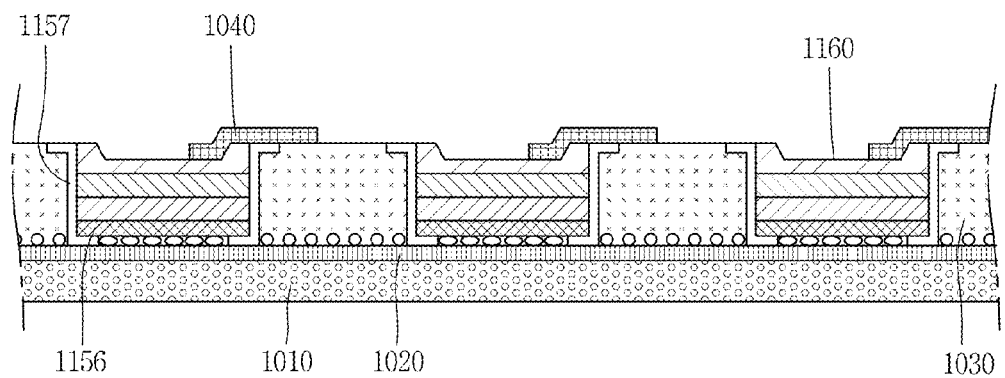
FIG. 12 is a cross-sectional view taken along line F-F in FIG. 10.
Figure 13:
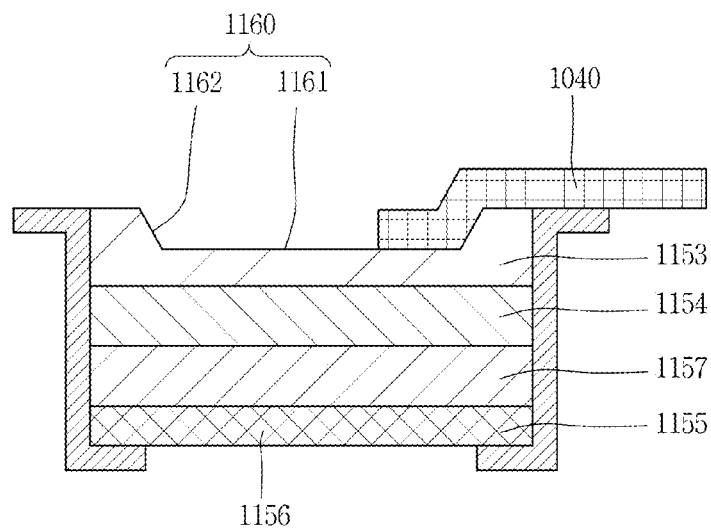
FIG. 13 is a conceptual view illustrating a new structure of semiconductor light emitting device in FIG. 11.
Figure 14:
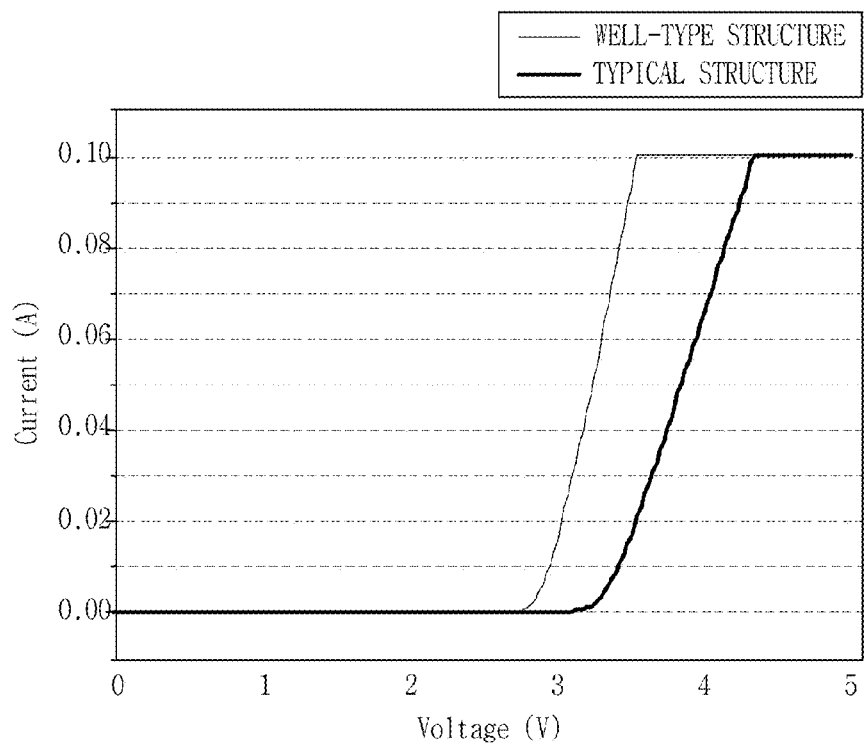
FIG. 14 is a current flow diagram in which the display device of FIG. 10 is compared with a display device in the related art.
Figure 15A:
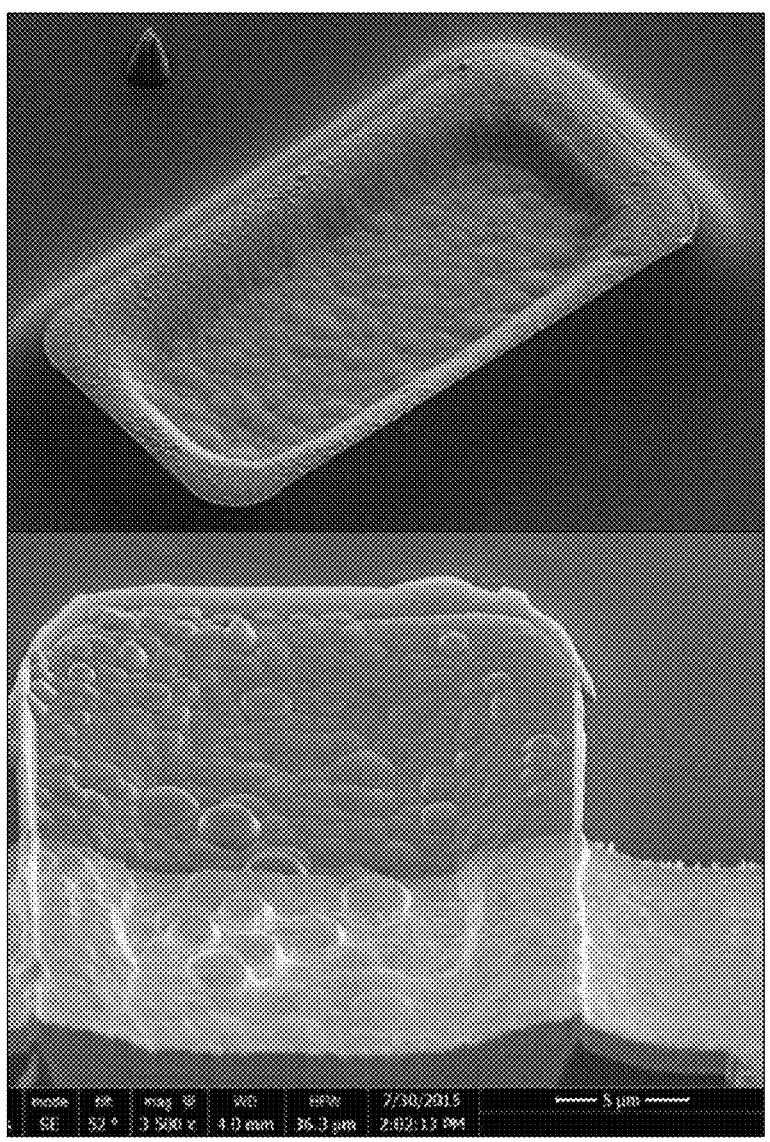
FIG. 15A is a product photo of a semiconductor light emitting device in FIG. 13.
Figure 15B:
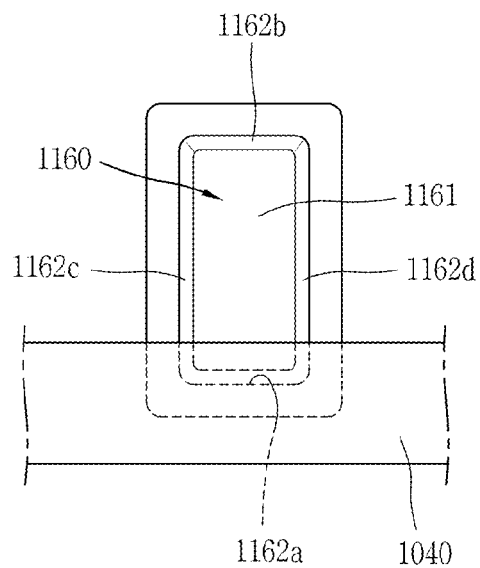
FIG. 15B is a plan view illustrating a well-type structure and a wiring electrode of the present disclosure.

The present disclosure presents a novel structure of semiconductor light emitting device capable of solving such a problem. Hereinafter, a display device to which a new structure of semiconductor light emitting device is applied and a fabrication method thereof will be described. In particular, FIG. 10 is an enlarged view illustrating portion "A" in FIG. 1 illustrating another embodiment of the present disclosure to which a new type semiconductor light emitting device is applied, FIG. 11 is a cross-sectional view taken along line E-E in FIG. 10, FIG. 12 is a cross-sectional view taken along line F-F in FIG. 10, and FIG. 13 is a conceptual view illustrating a new structure of semiconductor light emitting device in FIG. 11. Furthermore, FIG. 14 is a current flow graph in which the display device of FIG. 10 is compared with a display device in the related art, FIG. 15A is a product photo of a semiconductor light emitting device in FIG. 13, and FIG. 15B is a plan view illustrating a well-type structure and a wiring electrode of the present disclosure.

FIGS. 10 to 12 illustrate a display device 1000 using a passive matrix (PM) type of vertical semiconductor light emitting device as a display device 1000 using a semiconductor light emitting device. However, the example described below may be also applicable to an active matrix (AM) type of semiconductor light emitting device. As shown, the display device 1000 includes a substrate 1010, a first electrode 1020, a conductive adhesive layer 1030, a second electrode 1040 and a plurality of semiconductor light emitting devices 1050. Here, the first electrode 1020 and second electrode 1040 may include a plurality of electrode lines, respectively.

Further, the substrate 1010 as a wiring substrate disposed with the first electrode 1020 may include polyimide (PI) to implement a flexible display device. In addition, any one may be used if it is an insulating and flexible material. The first electrode 1020 can be located on the substrate 1010, and formed with a bar-shaped electrode elongated in one direction. The first electrode 1020 can also perform the role of a data electrode.

In addition, the conductive adhesive layer 1030 is formed on the substrate 1010 located with the first electrode 1020. Similarly to a display device to which a flip chip type light emitting device is applied, the conductive adhesive layer 1030 may be an anisotropic conductive film (ACF), an anisotropic conductive paste, a solution containing conductive particles, and the like. However, according to the present embodiment, the conductive adhesive layer 1030 may be replaced by an adhesive layer. For example, when the first electrode 1020 is not located on the substrate 1010 but integrally formed with a conductive electrode of the semiconductor light emitting device, the conductivity of the adhesive layer may not be required.

Further, a plurality of second electrodes 1040 disposed in a direction of crossing the length direction of the first electrode 1020, and electrically connected to the vertical semiconductor light emitting device 1050 can be located between the semiconductor light emitting devices. According to the drawing, the second electrode 1040 can be located on the conductive adhesive layer 1030. In other words, the conductive adhesive layer 1030 is disposed between a wiring substrate and the second electrode 1040. The second electrode 1040 can be electrically connected to the semiconductor light emitting device 1050 through contact.

According to the foregoing structure, a plurality of semiconductor light emitting devices 1050 are coupled to the conductive adhesive layer 1030, and electrically connected to the first electrode 1020 and second electrode 1040. According to circumstances, a transparent insulating layer containing silicon oxide (SiOx) can be formed on the substrate 1010 formed with the semiconductor light emitting device 1050. When the transparent insulating layer is formed and then the second electrode 1040 is placed thereon, the second electrode 1040 can be located on the transparent insulating layer. Furthermore, the second electrode 1040 can be formed to be separated from the conductive adhesive layer 1030 or transparent insulating layer.

As illustrated in the drawing, the plurality of semiconductor light emitting devices 1050 may form a plurality of columns in a direction in parallel to a plurality of electrode lines provided in the first electrode 1020. However, the present disclosure is not limited to this. For example, the plurality of semiconductor light emitting devices 1050 may form a plurality of columns along the second electrode 1040.

Moreover, the display device 1000 may further include a phosphor layer 1080 formed on one surface of the plurality of semiconductor light emitting devices 1050. For example, the semiconductor light emitting device 1050 is a blue semiconductor light emitting device that emits blue (B) light, and the phosphor layer 1080 converts the blue (B) light into the color of a sub-pixel. The phosphor layer 1080 may be a red phosphor layer 1081 or green phosphor layer 1082 constituting individual pixels. In other words, a red phosphor 1081 capable of converting blue light into red (R) light can be deposited on the blue semiconductor light emitting device 1051a at a location implementing a red sub-pixel, and a green phosphor 1082 capable of converting blue light into green (G) light can be deposited on the blue semiconductor light emitting device 1051b at a location implementing a green sub-pixel.

Furthermore, only the blue semiconductor light emitting device 1051c may be solely used at a location implementing a blue sub-pixel. In this instance, the red (R), green (G) and blue (B) sub-pixels may implement one pixel. More specifically, one color phosphor can be deposited along each line of the first electrode 1020. Accordingly, one line on the first electrode 1020 may be an electrode controlling one color. In other words, red (R), green (B) and blue (B) can be sequentially disposed along the second electrode 1040, thereby implementing sub-pixels. However, the present disclosure is not limited to this, and the semiconductor light emitting device 1050 can be combined with a quantum dot (QD) instead of a phosphor to implement sub-pixels such as red (R), green (G) and blue (B).

The display device may further include a black matrix 1091 disposed between each phosphor to enhance the contrast of the phosphor layer 1080. The black matrix 1091 can be formed so a gap is made between phosphor dots, and a black material fills into the gap. Thus, the black matrix 1091 can enhance the contrast between light and shade while at the same time absorbing external light reflection. Further, the black matrix 1091 is located between each phosphor along the first electrode 1020 in a direction on which the phosphor layer 1080 is deposited. In this instance, a phosphor layer is not formed at a location corresponding to the blue semiconductor light emitting device 1051, but black matrices can be formed at both sides by interposing a space with no the phosphor layer therebetween (or interposing the blue semiconductor light emitting device 1051c therebetween). The black matrix 1091 performs the role of a partition wall for preventing color mixture between phosphors.

Further, referring to the semiconductor light emitting device 1050 according to the present disclosure, for the semiconductor light emitting device 1050 in the present illustration, electrodes are disposed at the top/bottom, thereby having an advantage of reducing the chip size. However, the electrodes are disposed at both the top/bottom, and thus the light emitting surface may be hidden by the electrodes to reduce the area of a surface from which light is emitted from an upper portion thereof. More specifically, the display device includes a front surface on which visual information is displayed, and a portion electrically connected to the second electrode 1040 and the semiconductor light emitting device 1050 may hide light emitted from the semiconductor light emitting device toward the front surface.

Accordingly, a semiconductor light emitting device according to the present embodiment includes a mechanism of minimizing a portion on which a light emitting surface is hidden by an electrode as well as securing a contact surface on which the electrode is electrically connected to the semiconductor light emitting device to the maximum extent, and hereinafter, such a mechanism will be described in more detail. Referring to FIG. 13, for example, the semiconductor light emitting device 1050 may include a first conductive electrode 1156, a first conductive semiconductor layer 1155 formed with the first conductive electrode 1156, an active layer 1154 formed on the first conductive semiconductor layer 1155, and a second conductive semiconductor layer 1153 formed on the active layer 1154.

As illustrated in the drawing, the second electrode 1040 is connected to a second conductive semiconductor layer. The present embodiment will be described based on the second conductive electrode not being additionally provided on each semiconductor light emitting device, but the second conductive electrode is integrally formed with the second electrode 1040. In this instance, the second electrode can be formed without the process of depositing the second conductive electrode on each semiconductor light emitting device.

The first conductive semiconductor layer 1155 and second conductive semiconductor layer 1153 overlap with each other in a vertical direction (a thickness direction of the semiconductor light emitting device or display device), and the second electrode 1040 is disposed on an upper surface of the second conductive semiconductor layer 1153, and a first conductive electrode 1156 is disposed on a lower surface of the first conductive semiconductor layer 1155. In this instance, an upper surface of the second conductive semiconductor layer 1153 may be one surface of the second conductive semiconductor layer 1153 which is the farthest from the first conductive semiconductor layer 1155, and a lower surface of the first conductive semiconductor layer 1155 may be one surface of the first conductive semiconductor layer 1155 which is the farthest from the second conductive semiconductor layer 1153. Thus, the first conductive electrode 1156 and second electrode 1040 are disposed on the top and bottom, respectively, by interposing the first conductive semiconductor layer 1155 and the second conductive semiconductor layer 1153.

Referring to FIG. 13 along with FIGS. 10 through 12, a lower surface of the first conductive semiconductor layer 1155 may be a surface which is the closest to the wiring substrate, and an upper surface of the second conductive semiconductor layer may be a surface which is the farthest surface from the wiring substrate. More specifically, the first conductive electrode 1156 and first conductive semiconductor layer 1155 may be a p-type electrode and a p-type semiconductor layer, respectively, and the second electrode 1040 and second conductive semiconductor layer 1153 may be an n-type electrode and an n-type semiconductor layer, respectively. Further, the first conductive semiconductor layer 1155 may be a p-type GaN layer and the second conductive semiconductor layer 1153 may be an n-type GaN layer.

In this instance, a p-type electrode located at an upper portion thereof can be electrically connected to the first electrode 1020 by a conductive adhesive layer 1030, and an n-type electrode located at a lower portion thereof may connect the adjoining semiconductor light emitting devices to one another as the second electrode 1040. However, the present disclosure is not limited to this, and also includes the first conductive type is an n-type and the second conductive type is a p-type.

Here, the semiconductor light emitting device may include a passivation layer 1157 formed to surround the lateral surfaces of the first conductive semiconductor layer 1155 and the second conductive semiconductor layer 1153. The passivation layer 1157 is configured to surround a lateral surface of the semiconductor layer to result in the stabilization of the semiconductor light emitting device characteristics, and formed of an insulating material. Thus, a gap between the first conductive semiconductor layer 1155 and the second conductive semiconductor layer 1153 is electrically isolated by the passivation layer 1157, and thus the p-type GaN and n-type GaN of the semiconductor light emitting device may be insulated from each other.

Further, the active layer 1154 is disposed between the first conductive semiconductor layer 1155 and the second conductive semiconductor layer 1153 to emit light by a current flowing between the first conductive electrode 1156 and second electrode 1040. According to the present embodiment, at least one of the semiconductor light emitting devices may include a recess groove 1160 formed on at least part of the second conductive semiconductor layer 1153. At least part of the wiring electrode for supplying an electrical signal to the semiconductor light emitting devices can be disposed on the recess groove 1160.

For example, as illustrated in FIG. 13, the second electrode 1040 can be disposed on the recess groove 1160 as the wiring electrode. In other words, the second electrode 1040 is formed on the second conductive semiconductor layer 1153 to electrically connect the adjoining semiconductor light emitting devices in the left and right directions, and the second electrode is disposed on the recess groove 1160. However, the present disclosure is not limited to this, and the second conductive electrode may be also additionally provided on each semiconductor light emitting device. In this instance, the second conductive electrode 1152 is disposed on the recess groove 1160 as at least part of the wiring electrode, and the detailed description thereof will be described later.

Referring to FIGS. 13 and 15B, the recess groove 1160 may include a bottom portion 1161 and a lateral wall portion 1162. The lateral wall portion 1162 can be formed along an edge of the second conductive semiconductor layer 1153 to surround the bottom portion 1161. In this instance, the recess groove may be recessed from one surface of the second conductive semiconductor layer 1153 toward the other surface thereof, and a portion excluding the recess groove 1160 on the one surface can be formed in a rectangular annular shape.

In addition, the bottom portion 1161 is formed within a region of the second conductive semiconductor layer 1153 to overlap with the active layer 1154. Furthermore, the bottom portion 1161 can be disposed in parallel to one surface of the second conductive semiconductor layer 1153, and the lateral wall portion 1162 can be formed in a shape of completely surrounding the bottom portion 1161, and corresponding to the rectangular annular shape.

As illustrated in the drawing, the wiring electrode can be formed to cover at least part of the lateral wall portion 1162. More specifically, the second electrode 1040 is formed to cover at least part of the lateral wall portion 1162. In this instance, the second electrode 1040 can be disposed in a biased manner to either one side of the lateral wall portion 1162. For example, the lateral wall portion 1162 may include a pair of lateral walls 1162a, 1162b in parallel to each other, and the second electrode 1040 is configured to cover either one of the pair of lateral walls but does not cover the other one thereof.

Furthermore, the lateral wall portion may include another pair of lateral walls 1162c, 1162d disposed in perpendicular to the one pair of lateral walls, and the second electrode 1040 can be formed to cover part of the another pair of lateral walls. Here, the another pair of lateral walls may include a first lateral wall 1162c and a second lateral wall 1162d, and the second electrode 1040 may form a line sequentially passing through the first lateral wall 1162c, the bottom portion 1161 and the second lateral wall 1162d. Thus, according to a well-type structure in which the recess groove 1160 is formed on the second conductive semiconductor layer 1153, a contact area between the second electrode 1040 and the second conductive semiconductor layer 1153 increases as the second electrode 1040 is coated on the lateral wall portion to the minimum extent.

Referring to FIG. 15B, specifically, a height of the lateral wall portion 1162 can be 10 to 20 percent of either one length of the pair of lateral walls or 25 to 35 percent of a length of a portion on which the first lateral wall 1162c overlaps with the wiring electrode. For example, when the bottom portion 1161 forms a recess groove with 14 μm×34 μm when the size of the second conductive semiconductor layer is 20 μm×49 μm, a contact area between the second electrode 1040 and the second conductive semiconductor layer 1153 increases by about 1.25 times when the second electrode 1040 covers the second semiconductor light emitting device by 10 μm in a vertical direction.

As illustrated in the drawing, the lateral wall portion 1162 is configured to be inclined with respect to a direction perpendicular to the bottom portion 1161. For example, a cross-sectional area of the recess groove can be formed to increase as located farther from the first conductive semiconductor layer 1155 by the inclination of the lateral wall portion 1162. Since the lateral wall portion 1162 is inclined, an actual area of the lateral wall portion 1162 increases, and accordingly a contact area between the second electrode 1040 and the second conductive semiconductor layer 1153 increases compared to the foregoing value.

FIG. 14 is an I-V graph in which a display device in the related art is compared to the present disclosure, and it can be seen that a difference in the operating voltage is shown when the same current flows. For example, it is seen that the operating voltage decreases by 0.5 to 1 V at a current of 100 mA. As described above, according to a well-type structure of semiconductor light emitting device, it is possible to reduce the operating voltage as well as improve the light extraction efficiency.

Moreover, referring to FIGS. 15A and 15B, a surface of the bottom portion 1161 can be formed with an unevenness. The unevenness can be formed in a size of the micro-unit, and formed during the etching of the recess groove 1160 due to residues subsequent to separating the growth substrate from the second conductive semiconductor layer 1153.

The unevenness can be formed on at least part of the lateral wall portion 1162, and a size of the unevenness of the lateral wall portion 1162 may be smaller than that of the unevenness of the bottom portion 1161. This is because a lot of uneven surfaces corresponding to the shape of the residues are formed on the bottom portion due to the effect of the residues. A contact area between the second electrode 1040 and the second conductive semiconductor layer 1153 further increases due to the unevenness, and a light emitting surface of the semiconductor light emitting device may also increase.

According to the foregoing new structure of display device, it is possible to implement a fabrication process capable of securing reliability even at a process margin of the semiconductor light emitting device as well as provide a structure of enhancing the luminance while reducing the operating voltage.

Figure 16A:
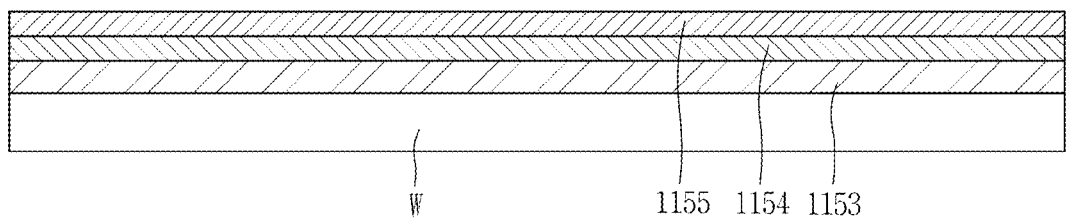
FIGS. 16A, 16B, 16C, 16D, 17A, 17B, 17C and 17D are cross-sectional views illustrating a fabrication method of a display device using a semiconductor light emitting device according to the present disclosure.

Hereinafter, a method of fabricating the foregoing new structure of display device will be described in more detail with reference to the accompanying drawings. FIGS. 16A to 17D are cross-sectional views illustrating a fabrication method of a display device using a semiconductor light emitting device according to the present disclosure. First, according to the fabrication method, the second conductive semiconductor layer 1153, active layer 1154, and first conductive semiconductor layer 1155, respectively, are grown on a growth substrate (W) (or semiconductor wafer) (FIG. 16A).

When the second conductive semiconductor layer 1153 is grown, the active layer 1154 is then grown on the second conductive electrode 1152, and then the first conductive semiconductor layer 1155 is grown on the active layer 1154. Thus, when the second conductive semiconductor layer 1153, active layer 1154 and first conductive semiconductor layer 1155 are sequentially grown, as illustrated in the drawing, the second conductive semiconductor layer 1153, active layer 1154 and first conductive semiconductor layer 1155 form a layered structure.

The growth substrate (W) can be formed of a material having light transmitting properties such as any one of sapphire ($Al_2O_3$), GaN, ZnO and A1O, but is not limited to this. Furthermore, the growth substrate (W) can be formed of a material suitable to semiconductor material growth, carrier wafer. The growth substrate 2101 can be formed of a material having a high thermal conductivity, and use a SiC substrate having a thermal conductivity higher than that of the sapphire substrate ($Al_2O_3$) or at least one of Si, GaAs, GaP, InP and $Ga_2O_3$ including a conductive substrate or insulating substrate. The second conductive semiconductor layer 1153 as an n-type semiconductor layer may be a nitride semiconductor layer such as n-GaN.

Next, an etching process of separating a p-type semiconductor and an n-type semiconductor, and forming a plurality of semiconductor light emitting devices isolated from one another on the substrate is performed. In other words, the first conductive semiconductor layer 1155, active layer 1154 and second conductive semiconductor layer 1153 are etched to isolate semiconductor light emitting devices on the substrate.

Figure 16B:
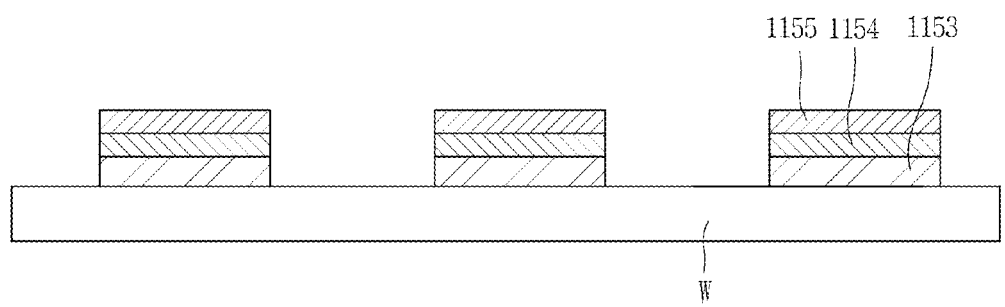

For example, referring to FIG. 16B, at least part of the first conductive semiconductor layer 1155, active layer 1154 and second conductive semiconductor layer 1153 are etched to form a plurality of semiconductor light emitting devices isolated from one another on the substrate. In this instance, the etching may be performed until when the substrate is emerged. In another example, the etching may be performed up to a state in which part of the second conductive semiconductor layer 1153 is remained between the semiconductor light emitting devices.

Figure 16C:
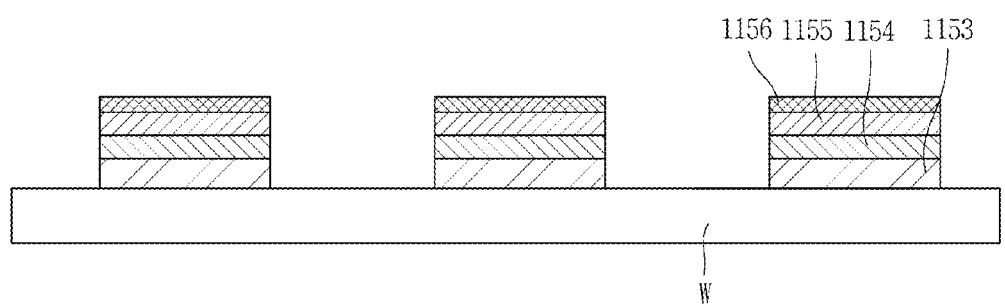

Next, at least one conductive electrode is formed on the semiconductor light emitting devices (FIG. 16C). More specifically, the first conductive electrode 1156 is formed on one surface of the first conductive semiconductor layer 1155. In other words, an array of semiconductor light emitting devices is formed on the substrate, and then the first conductive electrode 1156 is deposited on the first conductive semiconductor layer 1155.

Figure 16D:
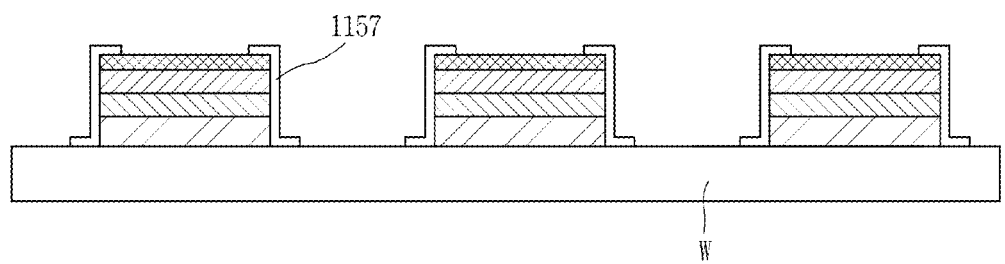

Then, the passivation layer 1157 formed to surround a lateral surface of the semiconductor light emitting devices is formed (FIG. 16D). The passivation layer 1157 may include a plurality of layers having different refractive indices to reflect light emitted to the lateral surface, and materials with relatively high and low refractive indices may be repeatedly deposited on the plurality of layers.

Figure 17A:
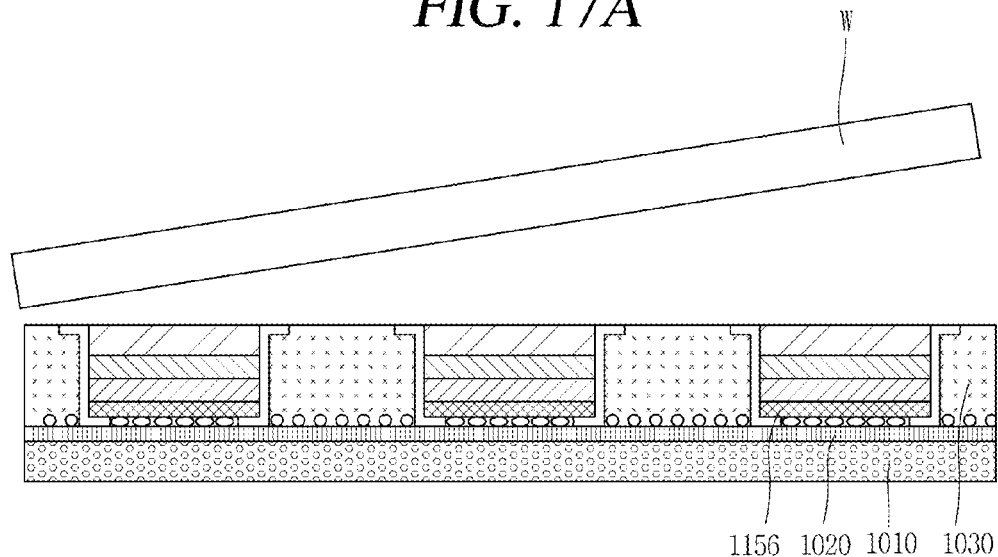

Then, the process of connecting the first conductive electrode to a wiring substrate, and separating the semiconductor light emitting device from the substrate, and forming a recess groove on the second conductive semiconductor layer through etching is performed. For example, semiconductor light emitting devices are coupled to a wiring substrate using a conductive adhesive layer, and a growth substrate is removed (FIG. 17A). The wiring substrate is when the first electrode 1020 is formed thereon, and the first electrode 1020 as lower wiring is electrically connected to the first conductive electrode 1156 by a conductive ball or the like within the conductive adhesive layer 1030.

Figure 18:
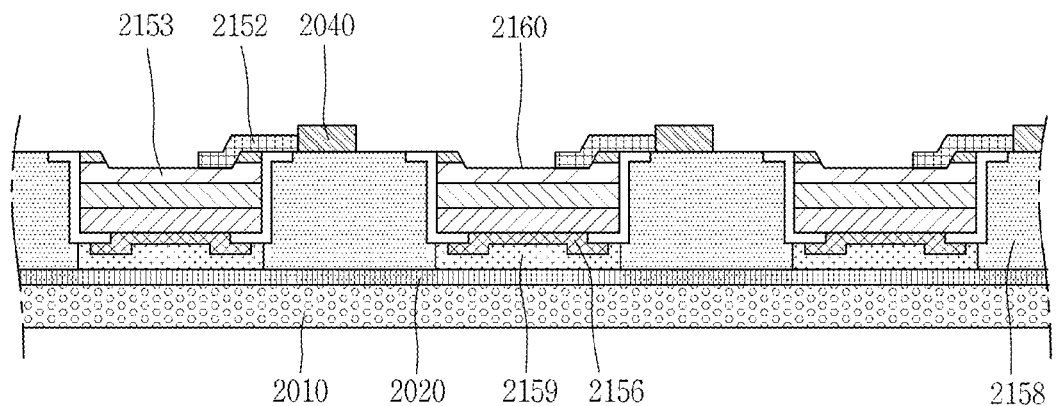
FIG. 18 is a cross-sectional view illustrating another embodiment of the present disclosure.

In another example, as illustrated in FIG. 18 which will be described later, a bonding metal can be formed on the wiring substrate to selectively bond a semiconductor light emitting device within a growth substrate to the wiring substrate. In this instance, the conductive adhesive layer is not required, and the bonding metal is disposed on the first electrode, and physically brought into contact with the first conductive electrode.

Figure 17B:
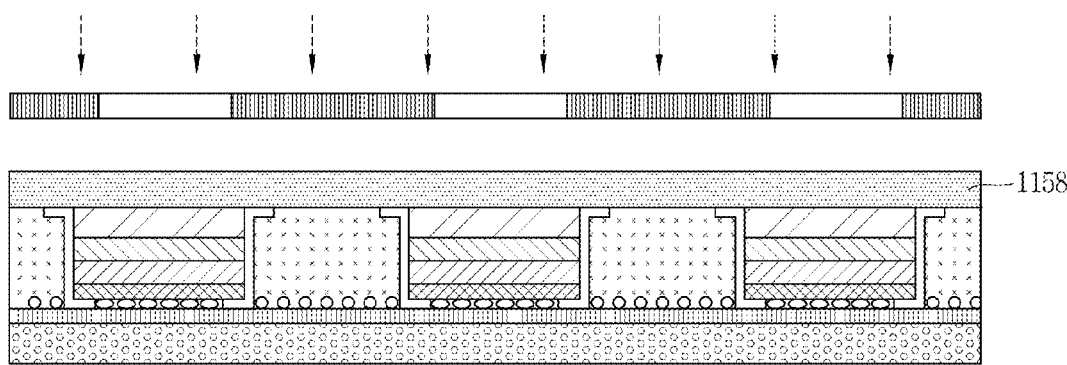

The growth substrate is removed using a laser lift-off (LLO) or chemical lift-off (CLO) method, and the semiconductor light emitting device is separated from the substrate. Next, a gap formed between the semiconductor light emitting devices is filled with a non-current-carrying material (FIG. 17B). For example, polyimide 1158 may be filled into the gap. Furthermore, the polyimide may be filled to completely cover the semiconductor light emitting device. In this instance, the polyimide may be filled between the semiconductor light emitting devices in a structure without the conductive adhesive layer.

Figure 17C:
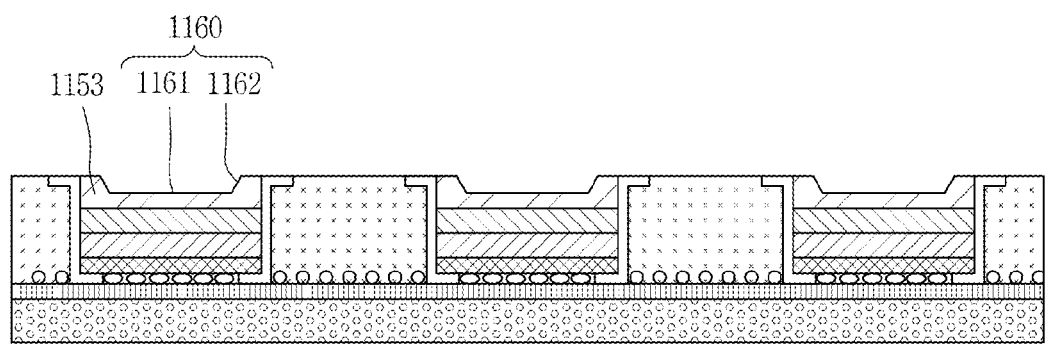
Figure 17D:
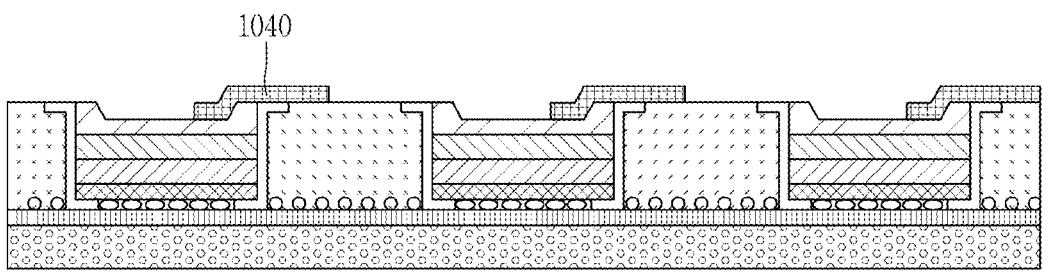

Then, a pattern is formed on the polyimide (FIG. 17B), and then a recess groove is formed on the second conductive semiconductor layer through etching (FIG. 17C). The recess groove 1160 may include a bottom portion 1161 and a lateral wall portion 1162 as described above. The lateral wall portion 1162 can be formed along an edge of the second conductive semiconductor layer 1153 to surround the bottom portion 1161. In this instance, the recess groove 1160 may be recessed from one surface of the second conductive semiconductor layer 1153 toward the other surface thereof, and a portion excluding the recess groove 1160 on the one surface can be formed in a rectangular annular shape.

Further, when the growth substrate is separated from the second conductive semiconductor layer 1153, a finite uneven surface may occur on the second conductive semiconductor layer 1153. In this instance, the etching may be performed when chemical treatment is not performed on the finite uneven surface to form an unevenness corresponding to the finite uneven surface on the recess groove 1160.

In another example, an undoped semiconductor layer can be formed on one surface of the second conductive semiconductor layer 1153. In this instance, the undoped semiconductor layer may be etched until the second conductive semiconductor layer 1153 is emerged to an outside thereof. According to such a structure, the second conductive semiconductor layer 1153 forms the bottom portion of the recess groove 1160. The undoped semiconductor layer forms the whole or most of the lateral wall portion 1162 of the recess groove 1160.

Furthermore, even at this time, the etching is performed without chemical treatment subsequent to separating the growth substrate and the undoped semiconductor layer to form an unevenness corresponding to the finite uneven surface on the recess groove 1160. More specifically, when a laser beam is emitted using a laser having a wavelength of ultraviolet region to remove the sapphire substrate, the sapphire and GaN layers are separated from each other.

During the process of separating the growth substrate, Ga residues (droplets) exist between two interfaces, and thus a surface thereof may be cleaned using hydrochloric acid or the like to remove them, but an un-GaN (an undoped non-current-carrying region) layer is dry-etched without the cleaning process. In this instance, a dry-etching rate or etching speed of the un-GaN layer varies depending on a region in which Ga residues are remained and a region in which Ga residues are not remained, and thus a texturing structure may be naturally formed thereon.

As illustrated in the drawing, the process of electrically connecting a second conductive semiconductor layer formed on the recess groove to a wiring electrode is then performed (FIG. 17D), and then a phosphor layer 1080 is formed to cover the semiconductor light emitting device. For example, the second electrode 1040 as upper wiring is directly connected to the second conductive semiconductor layer 1153. More specifically, the second electrode 1040 is deposited or printed on one surface of the second conductive semiconductor layer 1153 and on the recess groove to form the upper wiring of the semiconductor light emitting device.

At least part of a wiring electrode for supplying an electrical signal to the semiconductor light emitting devices can be disposed on the recess groove by the fabrication process. According to the foregoing fabrication method, a recess groove can be formed on one surface of the semiconductor light emitting devices, thereby implementing the luminance enhancement of the display device though it is a simple fabrication method.

Further, the present disclosure is not limited to the above fabrication method. In another example, it is possible to deposit the second conductive electrode 1152 on the second conductive semiconductor layer 1153 and the recess groove for each light emitting device, and then form the second electrode 1040 connected to the second conductive electrode 1152 of the light emitting devices. Thus, a display device using the foregoing semiconductor light emitting device may be modified in various forms, and hereinafter, the modifications will be described.

Figure 19:
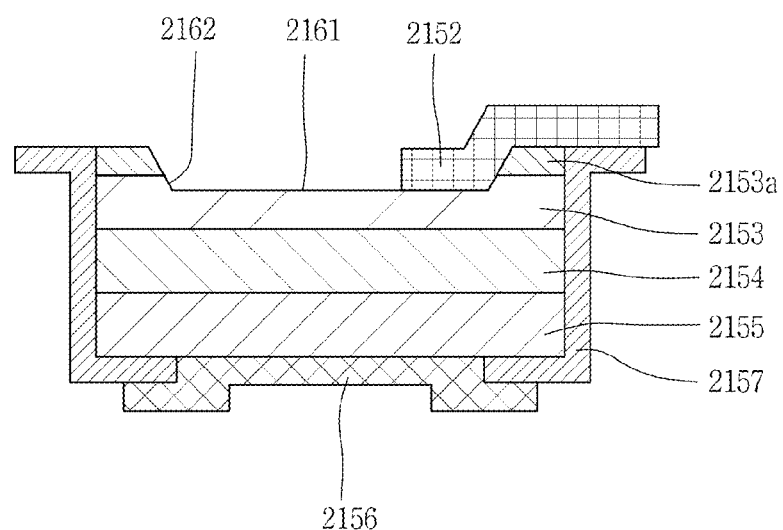
FIG. 19 is a conceptual view illustrating a new structure of semiconductor light emitting device.

Next, FIG. 18 is a cross-sectional view illustrating another embodiment of the present disclosure, and FIG. 19 is a conceptual view illustrating a new structure of semiconductor light emitting device. FIG. 18 illustrates a display device 2000 using a passive matrix (PM) type semiconductor light emitting device as a display device 2000 using a semiconductor light emitting device. However, the following illustration may be also applicable to an active matrix (AM) type semiconductor light emitting device.

The display device 2000 may include a substrate 2010, a first electrode 2020, a second electrode 2040, and a plurality of semiconductor light emitting devices 2050. Here, the first electrode 2020 and second electrode 2040 may include a plurality of electrode lines, respectively. The substrate 2010 as a wiring substrate on which the first electrode 2020 is disposed may include polyimide (PI) to implement a flexible display device. In addition, any one may be used if it is an insulating and flexible material.

The first electrode 2020 can be located on the substrate 2010, and formed with a bar-shaped electrode elongated in one direction. The first electrode 2020 can be formed to perform the role of a data electrode. Further, the second electrode 2040 is disposed at an opposite side to the first electrode around the semiconductor light emitting device.

The plurality of plurality of semiconductor light emitting devices 2050 are coupled to the substrate 2010, and electrically connected to the first electrode 2020 and second electrode 2040. More specifically, a plurality of second electrodes 2040 disposed in a direction of crossing the length direction of the first electrode 2020, and electrically connected to the semiconductor light emitting device 2050 can be located between the semiconductor light emitting devices.

As illustrated in the drawing, the plurality of semiconductor light emitting devices 2050 can form a plurality of columns in a direction in parallel to a plurality of electrode lines provided in the first electrode 2020. However, the present disclosure is not limited to this. For example, the plurality of semiconductor light emitting devices 2050 may form a plurality of columns along the second electrode 2040.

Referring to FIG. 19, for example, the semiconductor light emitting device 2050 may include a first conductive electrode 2156, a first conductive semiconductor layer 2155 formed with the first conductive electrode 2156, an active layer 2154 formed on the first conductive semiconductor layer 2155, and a second conductive semiconductor layer 2153 formed on the active layer 2154 and a second conductive electrode 2152 formed on the second conductive semiconductor layer 2153.

The first conductive electrode 2156 and first conductive semiconductor layer 2155 may be a p-type electrode and a p-type semiconductor layer, respectively, and the second conductive electrode 2152 and second conductive semiconductor layer 2153 may be an n-type electrode and a n-type semiconductor layer, respectively. However, the present disclosure is not limited to this, and may also have an illustration in which the first conductive type is an n-type and the second conductive type is a p-type.

More specifically, the first conductive electrode 2156 is formed on one surface of the first conductive semiconductor layer 2155, and the active layer 2154 is formed between the other surface of the first conductive semiconductor layer 2155 and one surface of the second conductive semiconductor layer 2153, and the second conductive electrode 2152 is formed on one surface of the second conductive semiconductor layer 2153.

As illustrated in the drawing, the first conductive electrode 2156 is brought into contact with the first electrode 2020. The first conductive electrode 2156 is formed of at least one of TiO, Ti, Pt and Au, and physically brought into contact with the first electrode by pressure. More specifically, a coupling bonding metal 2159 is disposed between the first conductive electrode 2156 and the first electrode 2020, and both surfaces of the bonding metal are pressurized and brought into contact with the first conductive electrode 2156 and the first electrode 2020, respectively. In this instance, there is no conductive adhesive layer, and thus polyimide 2158 may be filled between the semiconductor light emitting devices.

In this instance, the second conductive electrode can be disposed on one surface of the second conductive semiconductor layer 2153, and an undoped semiconductor layer 2153a can be formed on the other surface of the second conductive semiconductor layer 2153.

Referring to FIGS. 18 and 19, the second electrode 2040 and second conductive electrode 2152 may be connected to each other by an ohmic contact. For example, the second conductive electrode 2152 is formed as an ohmic electrode for an ohmic contact, and the second electrode 2040 covers at least part of the ohmic electrode by printing or deposition.

At least one of the semiconductor light emitting devices may include a recess groove formed on at least part of the undoped semiconductor layer 2153a and second conductive semiconductor layer 2153. At least part of the second conductive electrode for supplying an electrical signal to the semiconductor light emitting devices as part of the wiring electrode can be disposed on the recess groove 2160.

Referring to the present drawings, for example, the recess groove 2160 may include a bottom portion 2161 and a lateral wall portion 2162. The lateral wall portion 2162 can be formed along an edge of the second conductive semiconductor layer 2153 to surround the bottom portion 2161. In this instance, the recess groove 2160 may be recessed from one surface of the undoped semiconductor layer 2153a toward the other surface thereof, and a portion excluding the recess groove 2160 on the one surface can be formed in a rectangular annular shape.

The bottom portion 2161 is formed on the second conductive semiconductor layer to overlap with the active layer. Furthermore, the bottom portion 2161 can be disposed in parallel to one surface of the undoped semiconductor layer 2153a, and the lateral wall portion 2162 can be formed in a shape of completely surrounding the bottom portion, and corresponding to the rectangular annular shape.

As illustrated in the drawing, the second conductive electrode 2152 can be formed to cover at least part of the lateral wall portion 2162. More specifically, the second conductive electrode is formed to cover at least part of the lateral wall portion 2162. In this instance, the second conductive electrode can be disposed in a biased manner to either one side of the lateral wall portion 2162. For example, the lateral wall portion 2162 may include a pair of lateral walls in parallel to each other, and the second conductive electrode 2152 is configured to cover either one of the pair of lateral walls but does not cover the other one thereof.

Furthermore, the lateral wall portion may include another pair of lateral walls 1162c, 1162d disposed in perpendicular to the one pair of lateral walls, and the second conductive electrode can be formed to cover part of the another pair of lateral walls. Here, the another pair of lateral walls may include a first lateral wall and a second lateral wall (not shown, refer to FIG. 15B), and the second conductive electrode may form a line sequentially passing through the first lateral wall, the bottom portion and the second lateral wall. Thus, according to a well-type structure in which the recess groove is formed on the second conductive semiconductor layer, a contact area between the second conductive electrode and the second conductive semiconductor layer 1153 increases as the second conductive electrode is coated on the lateral wall portion to the minimum extent.

As illustrated in the drawing, the lateral wall portion is configured to be inclined with respect to a direction perpendicular to the bottom portion. For example, a cross-sectional area of the recess groove can be formed to increase as located farther from the first conductive semiconductor layer by the inclination of the lateral wall portion. Since the lateral wall portion is inclined, an actual area of the lateral wall portion may increase, and accordingly a contact area between the second conductive electrode and the second conductive semiconductor layer may further increase.

Moreover, a surface of the bottom portion can be formed with an unevenness (not shown, refer to FIG. 15A). The unevenness can be formed in a size of the micro-unit, and formed during the etching of the recess groove 1160 due to residues subsequent to separating the growth substrate from the second conductive semiconductor layer.

The unevenness can be formed on at least part of the lateral wall portion, and a size of the unevenness of the lateral wall portion may be smaller than that of the unevenness of the bottom portion. It is because a lot of uneven surfaces corresponding to the shape of the residues are formed on the bottom portion due to the effect of the residues. A contact area between the second conductive electrode and the second conductive semiconductor layer may further increase due to the unevenness, and a light emitting surface of the semiconductor light emitting device may also increase.

The present invention encompasses various modifications to each of the examples and embodiments discussed herein. According to the invention, one or more features described above in one embodiment or example can be equally applied to another embodiment or example described above. The features of one or more embodiments or examples described above can be combined into each of the embodiments or examples described above. Any full or partial combination of one or more embodiment or examples of the invention is also part of the invention.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A display device, comprising:
a substrate;
a first electrode on the substrate;
a plurality of semiconductor light emitting devices disposed on the first electrode; and
a second electrode,
wherein at least one of the semiconductor light emitting devices comprises:
a first conductive semiconductor layer;
a second conductive semiconductor layer overlapping with the first conductive semiconductor layer; and
an active layer between the first conductive semiconductor layer and the second conductive semiconductor layer,
wherein an upper surface of the second conductive semiconductor layer includes a recess groove having a bottom portion and a lateral wall portion formed along an edge of the second conductive semiconductor layer,
wherein the second electrode extends partially on the bottom portion of the groove and on the lateral wall portion,
wherein the second electrode comprises a wiring electrode being directly connected to the second conductive semiconductor layer and extending to electrically connect adjoining semiconductor light emitting devices in left and right directions,
wherein the lateral wall portion includes a first pair of lateral walls in parallel to each other, and the wiring electrode is configured to cover either one of the first pair of lateral walls but does not cover the other one thereof, and
wherein the lateral wall portion further includes a second pair of lateral walls in parallel to each other and the wiring electrode is configured to cover only a portion of the second pair of lateral walls.

2. The display device of claim 1, wherein the second pair of lateral walls comprises a first lateral wall and a second lateral wall, and
wherein the wiring electrode forms a line sequentially passing through the first lateral wall, the bottom and the second lateral wall.

3. The display device of claim 2, wherein a height of the lateral wall portion is 10 to 20 percent of either one length of the pair of lateral walls or 25 to 35 percent of a length of a portion on which the first lateral wall overlaps with the wiring electrode.

4. The display device of claim 1, wherein the first conductive semiconductor layer is a p-type GaN layer, the second conductive semiconductor layer is an n-type GaN layer, and the recess groove includes an etched portion of at least part of the n-type GaN layer.

5. The display device of claim 4, further comprising:
a front surface configured to display visual information, wherein the n-type GaN layer is disposed closer to the front surface than the p-type GaN layer.

6. The display device of claim 1, wherein the at least one of the semiconductor light emitting devices further comprises an undoped semiconductor layer formed to cover the second conductive semiconductor layer, and
wherein the recess groove is recessed toward the first conductive semiconductor layer on one surface of the undoped semiconductor layer.

7. The display device of claim 6, wherein the bottom portion is formed on the second conductive semiconductor layer, and the lateral wall portion is formed on the second conductive semiconductor layer and the undoped semiconductor layer.

8. The display device of claim 6, wherein the wiring electrode extends from one surface of the undoped semiconductor layer to the recess groove.

9. The display device of claim 1, wherein the bottom portion of the recess groove includes an uneven surface.

10. The display device of claim 9, wherein the uneven surface is formed on at least part of the lateral wall portion, and a size of the uneven surface of the lateral wall portion is smaller than that of the uneven surface of the bottom portion.

11. The display device of claim 1, wherein the lateral wall portion is inclined with respect to a direction perpendicular to the bottom portion.

12. The display device of claim 11, wherein a cross-sectional area of the recess groove increases as it is located farther from the first conductive semiconductor layer by the inclination of the lateral wall portion.

* * * * *